US012138671B2

(12) United States Patent
Nakamura et al.

(10) Patent No.: US 12,138,671 B2
(45) Date of Patent: Nov. 12, 2024

(54) SUBSTRATE TREATMENT DEVICE

(71) Applicant: Shibaura Mechatronics Corporation, Yokohama (JP)

(72) Inventors: Minami Nakamura, Yokohama (JP); Daisuke Matsushima, Yokohama (JP); Kensuke Demura, Yokohama (JP)

(73) Assignee: SHIBAURA MECHATRONICS CORPORATION, Kanagawa (JP)

( * ) Notice: Subject to any disclaimer, the term of this patent is extended or adjusted under 35 U.S.C. 154(b) by 677 days.

(21) Appl. No.: 17/181,227

(22) Filed: Feb. 22, 2021

(65) Prior Publication Data

US 2021/0276055 A1 Sep. 9, 2021

(30) Foreign Application Priority Data

Feb. 25, 2020 (JP) .................................. 2020-029911
Dec. 15, 2020 (JP) .................................. 2020-207678
Feb. 9, 2021 (JP) .................................. 2021-018927

(51) Int. Cl.
*B08B 7/00* (2006.01)
*B08B 3/10* (2006.01)
*B08B 7/04* (2006.01)
*G03F 7/00* (2006.01)
*G03F 7/20* (2006.01)
(Continued)

(52) U.S. Cl.
CPC .............. *B08B 7/0092* (2013.01); *B08B 3/10* (2013.01); *B08B 7/04* (2013.01); *G03F 7/70925* (2013.01); *H01L 21/67051* (2013.01); *H01L 21/68764* (2013.01); *B08B 7/0014* (2013.01);
(Continued)

(58) Field of Classification Search
CPC ........... B08B 3/10; B08B 7/04; B08B 7/0014; B08B 7/0092; H01L 21/67109; H01L 21/67253; H01L 21/68764; H01L 21/67051; G03F 1/82; G03F 7/70925
See application file for complete search history.

(56) References Cited

U.S. PATENT DOCUMENTS

2007/0131246 A1* 6/2007 Izumi ................ H01L 21/67745
134/198
2008/0121252 A1* 5/2008 Miya ..................... B08B 7/0092
134/4

(Continued)

FOREIGN PATENT DOCUMENTS

JP 2018-026436 A 2/2018
TW 201236052 A1 9/2012

*Primary Examiner* — Benjamin L Osterhout
(74) *Attorney, Agent, or Firm* — Pearne & Gordon LLP

(57) ABSTRACT

According to one embodiment, a substrate treatment device includes a placement stand configured to rotate a substrate, a cooling part configured to supply a cooling gas into a space between the placement stand and the substrate, a liquid supplier configured to supply a liquid on a surface of the substrate opposite to the placement stand side, a detector configured to detect a state of the liquid on the surface of the substrate, and a controller controlling at least one of a rotation speed of the substrate, a flow rate of the cooling gas, or a supply amount of the liquid. The controller sets the liquid on the surface of the substrate to be in a supercooled state, obtains a temperature of the liquid in the supercooled state at a start of freezing, and is configured to calculate a removal ratio of a contamination.

9 Claims, 13 Drawing Sheets

(51) Int. Cl.
*H01L 21/67* (2006.01)
*H01L 21/687* (2006.01)
*G03F 1/82* (2012.01)

(52) U.S. Cl.
CPC .......... *G03F 1/82* (2013.01); *H01L 21/67109* (2013.01); *H01L 21/67253* (2013.01)

(56) References Cited

U.S. PATENT DOCUMENTS

| | | |
|---|---|---|
| 2012/0186275 A1 | 7/2012 | Kato et al. |
| 2015/0020850 A1* | 1/2015 | Kato .................. B08B 3/10 134/4 |
| 2015/0020852 A1* | 1/2015 | Kato .................. H01L 21/6715 134/30 |
| 2018/0047559 A1 | 2/2018 | Kamiya et al. |
| 2018/0047565 A1* | 2/2018 | Inukai .................. B08B 7/0014 |
| 2018/0047566 A1* | 2/2018 | Otsubo .................. G03F 7/0002 |
| 2018/0272391 A1* | 9/2018 | Sakurai ............. H01L 21/68735 |
| 2020/0078833 A1* | 3/2020 | Takai ............... H01L 21/68728 |
| 2020/0078834 A1* | 3/2020 | Tanabe .............. H01L 21/68764 |
| 2020/0294822 A1* | 9/2020 | Tanabe .............. H01L 21/02057 |

* cited by examiner

| TEMPERATURE AT FREEZING START[°C] | -5 | -10 | -15 | -20 | -25 | -30 | -35 | -40 |
|---|---|---|---|---|---|---|---|---|
| REMOVAL RATIO[%] | 6.55 | 13.1 | 19.65 | 26.2 | 32.75 | 39.3 | 45.85 | 52.4 |
| 0 | – | – | – | – | – | – | – | – |
| 1 | 6.6 | 13.1 | 19.7 | 26.2 | 32.8 | 39.3 | 45.9 | 52.4 |
| 2 | 12.7 | 24.5 | 35.4 | 45.5 | 54.8 | 63.2 | 70.7 | 77.3 |
| 3 | 18.4 | 34.4 | 48.1 | 59.8 | 69.6 | 77.6 | 84.1 | 89.2 |
| 4 | 23.7 | 43.0 | 58.3 | 70.3 | 79.5 | 86.4 | 91.4 | 94.9 |
| 5 | 28.7 | 50.4 | 66.5 | 78.1 | 86.2 | 91.8 | 95.3 | 97.6 |
| 6 | 33.4 | 56.9 | 73.1 | 83.8 | 90.7 | 95.0 | 97.5 | 98.8 |
| 7 | 37.8 | 62.6 | 78.4 | 88.1 | 93.8 | 97.0 | 98.6 | 99.4 |
| 8 | 41.8 | 67.5 | 82.6 | 91.2 | 95.8 | 98.2 | 99.3 | 99.7 |
| 9 | 45.6 | 71.7 | 86.0 | 93.5 | 97.2 | 98.9 | 99.6 | 99.9 |
| 10 | 49.2 | 75.4 | 88.8 | 95.2 | 98.1 | 99.3 | 99.8 | 99.9 |
| 11 | 52.5 | 78.7 | 91.0 | 96.5 | 98.7 | 99.6 | 99.9 | 100.0 |
| 12 | 55.6 | 81.5 | 92.8 | 97.4 | 99.1 | 99.7 | 99.9 | 100.0 |
| 13 | 58.5 | 83.9 | 94.2 | 98.1 | 99.4 | 99.8 | 100.0 | 100.0 |
| 14 | 61.3 | 86.0 | 95.3 | 98.6 | 99.6 | 99.9 | 100.0 | 100.0 |
| 15 | 63.8 | 87.8 | 96.2 | 99.0 | 99.7 | 99.9 | 100.0 | 100.0 |
| 16 | 66.2 | 89.4 | 97.0 | 99.2 | 99.8 | 100.0 | 100.0 | 100.0 |
| 17 | 68.4 | 90.8 | 97.6 | 99.4 | 99.9 | 100.0 | 100.0 | 100.0 |
| 18 | 70.5 | 92.0 | 98.1 | 99.6 | 99.9 | 100.0 | 100.0 | 100.0 |
| 19 | 72.4 | 93.1 | 98.4 | 99.7 | 99.9 | 100.0 | 100.0 | 100.0 |
| 20 | 74.2 | 94.0 | 98.7 | 99.8 | 100.0 | 100.0 | 100.0 | 100.0 |
| 21 | 75.9 | 94.8 | 99.0 | 99.8 | 100.0 | 100.0 | 100.0 | 100.0 |
| 22 | 77.5 | 95.4 | 99.2 | 99.9 | 100.0 | 100.0 | 100.0 | 100.0 |
| 23 | 78.9 | 96.0 | 99.3 | 99.9 | 100.0 | 100.0 | 100.0 | 100.0 |
| 24 | 80.3 | 96.6 | 99.5 | 99.9 | 100.0 | 100.0 | 100.0 | 100.0 |
| 25 | 81.6 | 97.0 | 99.6 | 99.9 | 100.0 | 100.0 | 100.0 | 100.0 |
| 26 | 82.8 | 97.4 | 99.7 | 100.0 | 100.0 | 100.0 | 100.0 | 100.0 |
| 27 | 83.9 | 97.7 | 99.7 | 100.0 | 100.0 | 100.0 | 100.0 | 100.0 |
| 28 | 85.0 | 98.0 | 99.8 | 100.0 | 100.0 | 100.0 | 100.0 | 100.0 |
| 29 | 86.0 | 98.3 | 99.8 | 100.0 | 100.0 | 100.0 | 100.0 | 100.0 |
| 30 | 86.9 | 98.5 | 99.9 | 100.0 | 100.0 | 100.0 | 100.0 | 100.0 |

FIG. 8

SUBSTRATE TREATMENT DEVICE

CROSS-REFERENCE TO RELATED APPLICATIONS

This application is based upon and claims the benefit of priority from Japanese Patent Application No. 2020-029911, filed on Feb. 25, 2020, No. 2020-207678, filed on Dec. 15, 2020, and No. 2021-018927, Feb. 9, 2021; the entire contents of which are incorporated herein by reference.

FIELD

Embodiments described herein relate generally to a substrate treatment device.

BACKGROUND

A freeze-cleaning method has been proposed as a method for removing contaminations such as particles adhering to the surface of a substrate such as an imprint template, a photolithography mask, and a semiconductor wafer.

In the freeze-cleaning method, for example, when pure water is used as the liquid used for cleaning, the pure water and cooling gas are first supplied to the surface of the rotated substrate. Next, the supply of pure water is stopped, and a part of the supplied pure water is discharged to form a water film on the surface of the substrate. The water film is frozen by the cooling gas supplied to the substrate. When the water film freezes and an ice film is formed, contaminations such as particles are taken into the ice film and separated from the surface of the substrate. Next, pure water is supplied to the ice film to melt the ice film, and contaminations are removed from the surface of the substrate together with the pure water.

However, if stress is generated between the ice film and the substrate due to the volume change of the ice film, the surface of the substrate may be damaged. In particular, when fine uneven portions are formed on the surface of the substrate, the fine uneven portions may be damaged.

Therefore, it has been desired to develop a substrate treatment device capable of suppressing damage to uneven portions formed on the surface of the substrate and improving the removal ratio of contaminations.

BRIEF DESCRIPTION OF THE DRAWINGS

FIG. 8 is a table for illustrating a relationship between the temperature at start of freezing and the number of times of freeze cleaning process;

DETAILED DESCRIPTION

Figure 1:
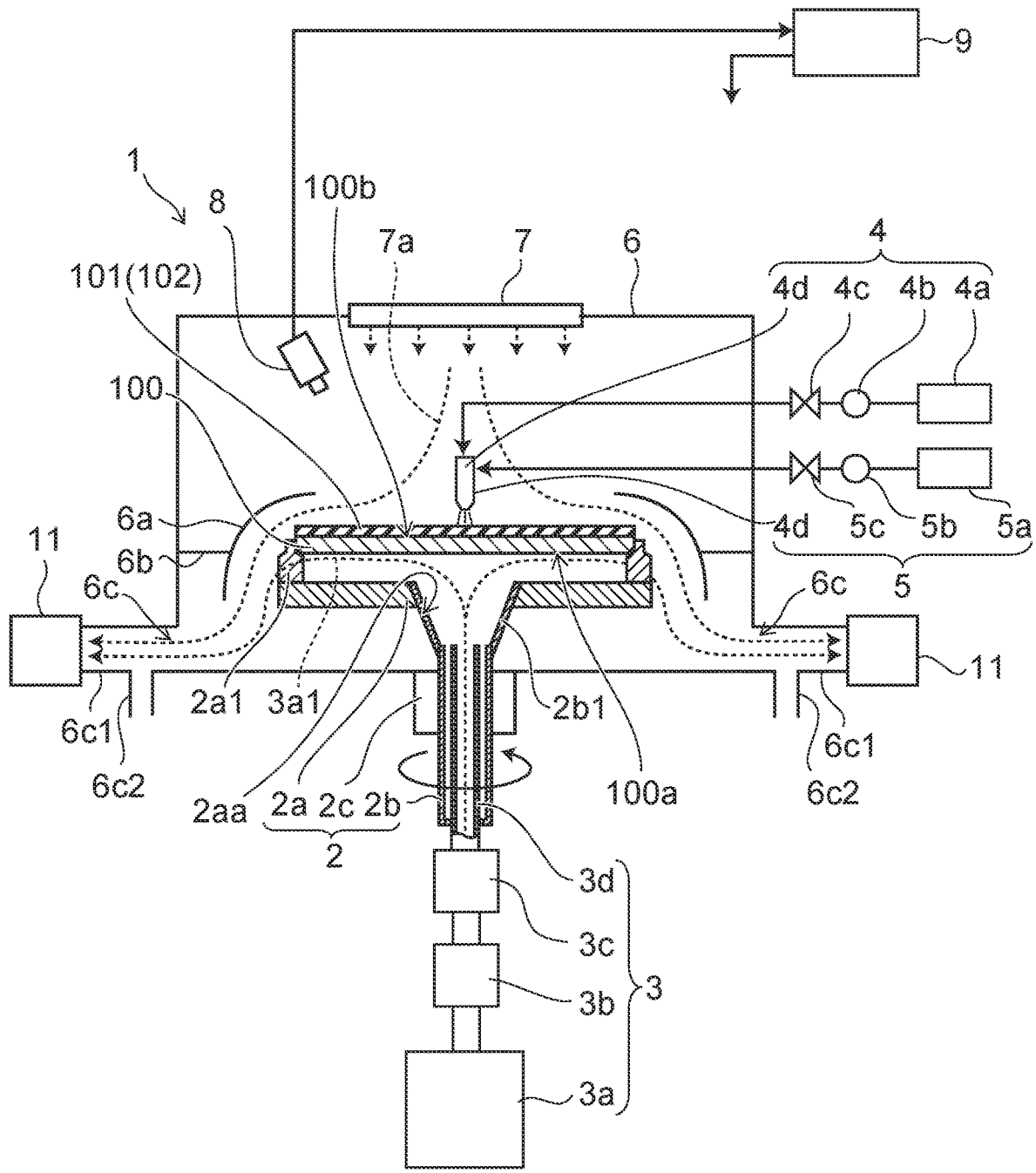
FIG. 1 is a schematic view for illustrating a substrate treatment device according to the embodiment.

According to one embodiment, a substrate treatment device includes a placement stand configured to rotate a substrate, a cooling part configured to supply a cooling gas into a space between the placement stand and the substrate, a liquid supplier configured to supply a liquid on a surface of the substrate opposite to the placement stand side, a detector configured to detect a state of the liquid on the surface of the substrate; and a controller controlling at least one of a rotation speed of the substrate, a flow rate of the cooling gas, or a supply amount of the liquid. The controller sets the liquid on the surface of the substrate to be in a supercooled state, obtains a temperature of the liquid in the supercooled state at a start of freezing based on data from the detector, and is configured to calculate a removal ratio of a contamination from a relationship between a temperature at the start of freezing obtained in advance and a removal ratio of the contamination, and the temperature at the start of freezing obtained in advance.

Various embodiments are described below with reference to the accompanying drawings.

In the specification and drawings, similar components are marked with like reference numerals, and a detailed description is omitted as appropriate.

The substrate 100 illustrated below can be, for example, a semiconductor wafer, an imprint template, a photolithography mask, a plate-like body used for MEMS (Micro Electro Mechanical Systems), or the like. However, the use of the substrate 100 is not limited to these. Further, the substrate 100 may have uneven portions on the surface thereof.

Further, in the following, as an example, a case where the substrate 100 is a mask for photolithography will be described. When the substrate 100 is a mask for photolithography, the planar shape of the substrate 100 can be a substantially quadrangle.

An uneven portion, which is a mask pattern, is formed on the surface of the substrate 100.

FIG. 1 is a schematic view for illustrating a substrate treatment device 1 according to the embodiment.

Figure 2:
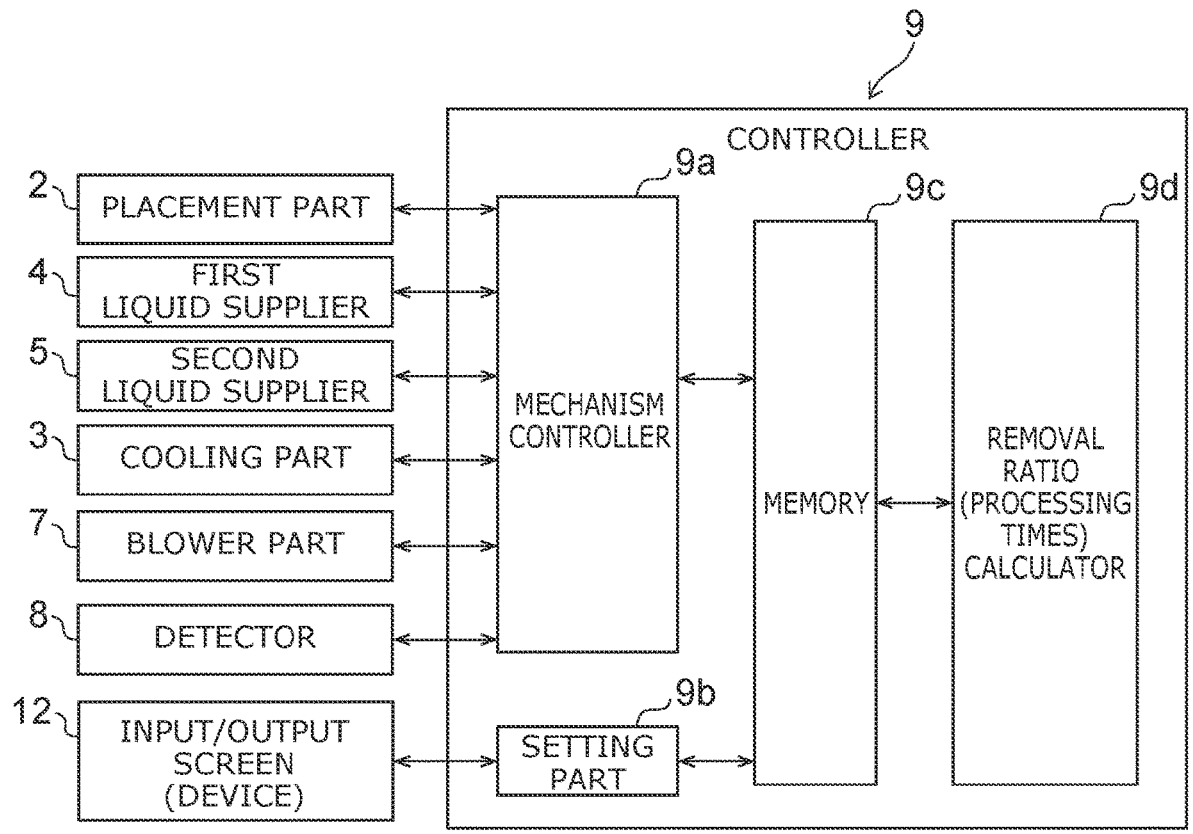
FIG. 2 is a schematic view for illustrating a controller of the substrate treatment device according to the embodiment.

FIG. 2 is a schematic view for illustrating a controller 9 of the substrate treatment device according to the embodiment.

As shown in FIG. 1, the substrate treatment device 1 includes a placement part 2, a cooling part 3, a first liquid supplier 4, a second liquid supplier 5, a housing 6, a blower part 7, a detector 8, and a controller 9. Further, as shown in FIG. 2, the controller 9 is provided with a mechanism controller 9a, a setting part 9b, a memory 9c (memory element), and a removal ratio calculator 9d (processing number of times calculator).

The placement part 2 includes a placement stand 2a, a rotation axis 2b, and a drive part 2c.

The placement stand 2a is rotatably provided inside the housing 6. The placement stand 2a has a plate shape. Multiple support portions 2a1 for supporting the substrate 100 are provided on one major surface of the placement stand 2a. When the substrate 100 is supported by the multiple support portions 2a1, the surface 100b (the surface on which the uneven portion is formed) of the substrate 100 faces a direction opposite to the placement stand 2a side.

The edges of the back surface 100a of the substrate 100 come into contact with the multiple support portions 2a1. The portion of the support portion 2a1 that comes into contact with the edge of the back surface 100a of the substrate 100 can be a tapered surface or an inclined surface. If the portion of the support portion 2a1 that contacts the edge of the back surface 100a of the substrate 100 is a tapered surface, the support portion 2a1 and the edge of the back surface 100a of the substrate 100 can be brought into point contact. If the portion of the support portion 2a1 that contacts the edge of the back surface 100a of the substrate 100 is an inclined surface, the support portion 2a1 and the edge of the back surface 100a of the substrate 100 can be brought into line contact. If the support portion 2a1 and the edge of the back surface 100a of the substrate 100 are in point contact or line contact, it is possible to suppress the substrate 100 from being soiled or damaged.

Further, a hole 2aa piercing the thickness direction of the placement stand 2a is provided in the central portion of the placement stand 2a.

One end of the rotating shaft 2b is fitted into the hole 2aa of the placement stand 2a. The other end of the rotating shaft 2b is provided on the outside of the housing 6. The rotating shaft 2b is connected to the drive part 2c outside the housing 6.

The rotating shaft 2b has a tubular shape. A blowout portion 2b1 is provided at the end of the rotating shaft 2b on the placement stand 2a side. The blowout portion 2b1 is open to the surface of the placement stand 2a where multiple supporting portions 2a1 are provided. The opening-side end of the blowout portion 2b1 is connected to the inner wall of the hole 2aa. The opening of the blowout portion 2b1 faces the back surface 100a of the substrate 100 placed on the placement stand 2a.

The blowout portion 2b1 has a shape in which the cross-sectional area increases toward the placement stand 2a side (opening side). Therefore, the cross-sectional area of the hole inside the blowout portion 2b1 increases toward the placement stand 2a side (opening side). Although the case where the blowout portion 2b1 is provided at the tip of the rotating shaft 2b has been illustrated, the blowout portion 2b1 can also be provided at the tip of the cooling nozzle 3d described later. Further, the hole 2aa of the placement stand 2a can be used as the blowing portion 2b1.

If the blowing portion 2b1 is provided, the released cooling gas 3a1 can be supplied to a wider area of the back surface 100a of the substrate 100. In addition, the release rate of the cooling gas 3a1 can be reduced. Therefore, it is possible to suppress the substrate 100 from being partially cooled or the cooling rate of the substrate 100 from becoming too fast. As a result, it becomes easy to generate a supercooled state of the liquid 101, which will be described later. Further, the supercooled state of the liquid 101 can be generated in a wider region of the surface 100b of the substrate 100. Therefore, the removal ratio of contaminations can be improved.

A cooling nozzle 3d is attached to the end of the rotating shaft 2b on the side opposite to the placement stand 2a side. A rotating shaft seal (not shown) is provided between the end of the rotating shaft 2b on the side opposite to the placement stand 2a side and the cooling nozzle 3d. Therefore, the end of the rotating shaft 2b on the side opposite to the placement stand 2a side is sealed so as to be airtight.

The drive part 2c is provided outside the housing 6. The drive part 2c is connected to the rotating shaft 2b. The drive part 2c can have a rotating device such as a motor. The rotational force of the drive part 2c is transmitted to the placement stand 2a via the rotation shaft 2b. Therefore, the drive part 2c can rotate the placement stand 2a and, in addition, the substrate 100 placed on the placement stand 2a.

Further, the drive part 2c can not only start and stop the rotation but also change the rotations per minute (rotation speed). The drive part 2c may be provided with a control motor such as a servo motor, for example.

The cooling part 3 supplies the cooling gas 3a1 to the space between the placement stand 2a and the back surface 100a of the substrate 100. The cooling part 3 includes a coolant part 3a, a filter 3b, a flow rate controller 3c, and a cooling nozzle 3d. The coolant part 3a, the filter 3b, and the flow rate controller 3c are provided outside the housing 6.

The coolant part 3a stores the coolant and generates the cooling gas 3a1. The coolant is a liquefied cooling gas 3a1. The cooling gas 3a1 is not particularly limited as long as it is a gas that does not easily react with the material of the substrate 100. The cooling gas 3a1 can be, for example, an inert gas such as nitrogen gas, helium gas, or argon gas.

In this case, the cooling time of the substrate 100 can be shortened by using a gas having a high specific heat. For example, if helium gas is used, the cooling time of the substrate 100 can be shortened. Further, if nitrogen gas is used, the processing cost of the substrate 100 can be reduced.

The coolant part 3a includes a tank for storing the coolant and a vaporizer for vaporizing the coolant stored in the tank. The tank is provided with a cooling device for maintaining the temperature of the coolant. The vaporizer raises the temperature of the coolant to generate the cooling gas 3a1 from the coolant. For the vaporizer, for example, the outside air temperature can be used, or heating with a heat medium can be used. The temperature of the cooling gas 3a1 may be a temperature equal to or lower than the freezing point of the liquid 101, and can be, for example, $-170°$ C.

Although the case where the coolant part 3a generates the cooling gas 3a1 by vaporizing the coolant stored in the tank is illustrated, it is also possible to cool the nitrogen gas or the like with a chiller or the like to obtain the cooling gas 3a1. By doing so, the coolant portion can be simplified.

The filter 3b is connected to the coolant part 3a via a pipe. The filter 3b suppresses the outflow of contaminations such as particles included in the coolant to the substrate 100 side.

The flow rate controller 3c is connected to the filter 3b via a pipe. The flow rate controller 3c controls the flow rate of the cooling gas 3a1. The flow rate controller 3c can be, for example, an MFC (Mass Flow Controller) or the like. Further, the flow rate controller 3c may indirectly control the flow rate of the cooling gas 3a1 by controlling the supply pressure of the cooling gas 3a1. In this case, the flow rate controller 3c can be, for example, an APC (Auto Pressure Controller).

The temperature of the cooling gas 3a1 generated from the coolant in the coolant part 3a is substantially a predetermined temperature. Therefore, the flow rate controller 3c can control the flow rate of the cooling gas 3a1 to control the temperature of the substrate 100 and, in addition, the temperature of the liquid 101 on the surface 100b of the substrate 100. In this case, by controlling the flow rate of the cooling gas 3a1 by the flow rate controller 3c, the supercooled state of the liquid 101 can be generated in a supercooling process described later.

The cooling nozzle 3d has a tubular shape. One end of the cooling nozzle 3d is connected to the flow controller 3c. The other end of the cooling nozzle 3d is provided inside the rotating shaft 2b. The other end of the cooling nozzle 3d is located near the end of the blowout portion 2b1 opposite to the placement stand 2a side (opening side).

The cooling nozzle 3d supplies the cooling gas 3a1 whose flow rate is controlled by the flow rate controller 3c to the substrate 100. The cooling gas 3a1 discharged from the cooling nozzle 3d is directly supplied to the back surface 100a of the substrate 100 via the blowout portion 2b1.

The first liquid supplier 4 supplies the liquid 101 to the surface 100b of the substrate 100. In the freezing process described later, the liquid 101 uses contaminations as a starting point for freezing when it changes to a solid. In addition, the volume expansion of the liquid 101 during freezing causes the contamination that is the starting point of freezing to be separated from the surface of the substrate 100. Further, when the liquid 101 changes to a solid, the volume changes, so that a pressure wave is generated. It is considered that the contaminations adhering to the surface 100b of the substrate 100 are separated by this pressure wave. Therefore, the liquid 101 is not particularly limited as long as it does not easily react with the material of the substrate 100. The supercooled liquid 101 also has a property that a change in density due to non-uniform temperature of the liquid film, the presence of contaminations such as particles, vibration, and the like are the starting points of freezing. That is, some percentage of the starting point of freezing also has the property of becoming a contamination.

If the liquid 101 is a liquid whose volume increases when it is frozen, it is considered that the contaminations adhering to the surface of the substrate 100 can be separated by utilizing the physical force accompanying the volume increase. Therefore, it is preferable that the liquid 101 is a liquid that does not easily react with the material of the substrate 100 and whose volume increases when frozen. For example, the liquid 101 can be water (for example, pure water, ultrapure water, etc.), a liquid including water as a main component, or the like.

The liquid including water as a main component can be, for example, a mixed solution of water and alcohol, a mixed solution of water and an acidic solution, a mixed solution of water and an alkaline solution, and the like.

Since the surface tension can be reduced by using a mixed solution of water and alcohol, it becomes easy to supply the liquid 101 to the inside of the fine uneven portion formed on the surface 100b of the substrate 100.

If a mixed solution of water and an acidic solution is used, contaminations such as particles and resist residues adhering to the surface of the substrate 100 can be dissolved. For example, a mixed solution of water and sulfuric acid can dissolve contaminations made of resist or metal.

If a mixed solution of water and an alkaline solution is used, the zeta potential can be lowered, so that the contaminations separated from the surface 100b of the substrate 100 can be suppressed from reattaching to the surface 100b of the substrate 100.

However, if the amount of components other than water is too large, it becomes difficult to utilize the physical force associated with the increase in volume, so that the removal ratio of contaminations may decrease. Therefore, the concentration of components other than water is preferably 5 wt % or more and 30 wt % or less.

Further, the gas can be dissolved in the liquid 101. The gas can be, for example, carbon dioxide gas, ozone gas, hydrogen gas, or the like. If carbon dioxide gas is dissolved in the liquid 101, the conductivity of the liquid 101 can be increased, so that electrification removal or electrification prevention of the substrate 100 can be performed. If ozone gas is dissolved in the liquid 101, contaminations made of organic substances can be dissolved.

The first liquid supplier 4 includes a liquid storage part 4a, a supplier 4b, a flow rate controller 4c, and a liquid nozzle 4d. The liquid storage part 4a, the supplier 4b, and the flow rate controller 4c are provided outside the housing 6.

The liquid storage part 4a stores the liquid 101 described above. The liquid 101 is stored in the liquid storage part 4a at a temperature higher than the freezing point. The liquid 101 is stored at room temperature (20° C.), for example.

The supplier 4b is connected to the liquid storage part 4a via a pipe. The supplier 4b supplies the liquid 101 stored in the liquid storage part 4a toward the liquid nozzle 4d. The supplier 4b can be, for example, a pump having resistance to the liquid 101. Although the case where the supplier 4b is a pump has been illustrated, the supplier 4b is not limited to the pump. For example, the supplier 4b may supply gas to the inside of the liquid storage part 4a and pump the liquid 101 stored in the liquid storage part 4a.

The flow rate controller 4c is connected to the supplier 4b via a pipe. The flow rate controller 4c controls the flow rate of the liquid 101 supplied by the supplier 4b. The flow rate controller 4c can be, for example, a flow rate control valve. In addition, the flow rate controller 4c can also start and stop the supply of the liquid 101.

The liquid nozzle 4d is provided inside the housing 6. The liquid nozzle 4d has a tubular shape. One end of the liquid nozzle 4d is connected to the flow controller 4c via a pipe. The other end of the liquid nozzle 4d faces the surface 100b of the substrate 100 placed on the placement stand 2a. Therefore, the liquid 101 discharged from the liquid nozzle 4d is supplied to the surface 100b of the substrate 100.

The other end of the liquid nozzle 4d (the discharge port of the liquid 101) is faced substantially the center of the surface 100b of the substrate 100. The liquid 101 discharged from the liquid nozzle 4d spreads from substantially the center of the surface 100b of the substrate 100, and a liquid film having a substantially constant thickness is formed on the surface 100b of the substrate 100. In the following, the film of the liquid 101 formed on the surface 100b of the substrate 100 will be referred to as a liquid film.

The second liquid supplier 5 supplies the liquid 102 to the surface 100b of the substrate 100. The second liquid supplier 5 includes a liquid storage part 5a, a supplier 5b, a flow rate controller 5c, and a liquid nozzle 4d.

The liquid 102 can be used in the thawing process described later. Therefore, the liquid 102 is not particularly limited as long as it does not easily react with the material of the substrate 100 and does not easily remain on the surface 100b of the substrate 100 in the drying process described later. The liquid 102 can be, for example, water (for example, pure water, ultrapure water, etc.), a mixed solution of water and alcohol, or the like.

The liquid storage part 5a can be the same as the liquid storage part 4a described above. The supplier 5b can be the same as the supplier 4b described above. The flow rate controller 5c can be the same as the flow rate controller 4c described above.

When the liquid 102 and the liquid 101 are the same, the second liquid supplier 5 can be omitted. Further, although the case where the liquid nozzle 4d is also shared is illustrated, a liquid nozzle for discharging the liquid 101 and a liquid nozzle for discharging the liquid 102 may be provided separately.

Further, the temperature of the liquid 102 can be higher than the freezing point of the liquid 101. Further, the temperature of the liquid 102 can be set to a temperature at which the frozen liquid 101 can be thawed. The temperature of the liquid 102 can be, for example, about room temperature (20° C.).

When the second liquid supplier 5 is omitted, the first liquid supplier 4 is used in the thawing process. That is, the liquid 101 is used. The temperature of the liquid 101 can also be a temperature at which the frozen liquid 101 can be thawed. The temperature of the liquid 101 can be, for example, about room temperature (20° C.).

The housing 6 has a box shape. A cover 6a is provided inside the housing 6. The cover 6a receives the liquids 101 and 102 supplied to the substrate 100 and discharged to the outside of the substrate 100 by rotating the substrate 100. The cover 6a has a tubular shape. The vicinity of the end of the cover 6a opposite to the placement stand 2a side (near the upper end of the cover 6a) is bent toward the center of the cover 6a. Therefore, it is possible to easily capture the liquids 101 and 102 scattered above the substrate 100.

Further, a partition plate 6b is provided inside the housing 6. The partition plate 6b is provided between the outer surface of the cover 6a and the inner surface of the housing 6.

Multiple discharge ports 6c are provided on the bottom surface side of the housing 6. In the case of the housing 6 illustrated in FIG. 1, two discharge ports 6c are provided. The used cooling gas 3a1, air 7a, liquid 101, and liquid 102 are discharged from the discharge port 6c to the outside of the housing 6. An exhaust pipe 6c1 is connected to the discharge port 6c, and an exhaust part (pump) 11 for exhausting the used cooling gas 3a1 and air 7a is connected to the exhaust pipe 6c1. Further, a discharge pipe 6c2 for discharging the liquids 101 and 102 is connected to the discharge port 6c.

The discharge port 6c is provided below the substrate 100. Therefore, the cooling gas 3a1 is exhausted from the discharge port 6c to create a downflow flow. As a result, it is possible to prevent the particles from soaring.

In a plan view, the multiple discharge ports 6c are provided so as to be symmetrical with respect to the center of the housing 6. In this way, the exhaust direction of the cooling gas 3a1 becomes symmetrical with respect to the center of the housing 6. If the exhaust directions of the cooling gas 3a1 are symmetrical, the exhaust of the cooling gas 3a1 becomes smooth.

The blower part 7 is provided on the ceiling surface of the housing 6. The blower part 7 may be provided on the side surface of the housing 6 as long as it is on the ceiling side. The blower part 7 can include a filter and a blower such as a fan. The filter can be, for example, a HEPA filter (High Efficiency Particulate Air Filter) or the like.

The blower part 7 supplies air 7a (outside air) to the space between the partition plate 6b and the ceiling of the housing 6. Therefore, the pressure in the space between the partition plate 6b and the ceiling of the housing 6 becomes higher than the external pressure. As a result, it becomes easy to guide the air 7a supplied by the blower part 7 to the discharge port 6c. In addition, it is possible to prevent contaminations such as particles from entering the inside of the housing 6 from the discharge port 6c.

Further, the blower part 7 supplies the air 7a at room temperature to the surface 100b of the substrate 100. Therefore, the blower part 7 can change the temperature of the liquids 101 and 102 on the substrate 100 by controlling the supply amount of the air 7a. Therefore, the blower part 7 can control the supercooled state of the liquid 101 in the supercooling process described later, promote the thawing of the liquid 101 in the thawing process, or promote the drying of the liquid 102 in the drying process.

The detector 8 is provided in the space between the partition plate 6b and the ceiling of the housing 6. The detector 8 detects the state of the liquid 101 on the surface 100b of the substrate 100.

The detector 8 detects, for example, the temperature of the supercooled liquid 101 on the surface 100b of the substrate 100. The detector 8 can be, for example, a temperature sensor such as a radiation thermometer, a thermoviewer, a thermocouple, or a resistance temperature detector.

Further, the detector 8 may detect, for example, the cloudy state of the supercooled liquid 101 on the surface 100b of the substrate 100. For example, the detector 8 detects the transmittance, reflectance, refractive index, etc. of the supercooled liquid 101. For example, the detector 8 can be a refractive index meter, a laser displacement meter, an image processing device, or the like.

Further, by providing multiple detectors 8 or allowing the detector 8 to move inside the housing 6, it is possible to detect the temperature at multiple positions on the surface 100b of the substrate 100. In this way, since the "temperature at the start of freezing of the supercooled liquid 101" described later can be measured at multiple positions, the freeze-cleaning process can be executed repeatedly based on the temperature at the position where the removal ratio is predicted to be the lowest. That is, the influence of the in-plane distribution of "the temperature at the start of freezing of the supercooled liquid 101" can be reduced.

If the detector 8 is a temperature sensor, it can directly detect the "temperature at the start of freezing of the supercooled liquid 101" described later. If the "temperature at the start of freezing of the supercooled liquid 101" can be directly detected, the "ratio of solid to liquid" described later can be calculated accurately and quickly. Therefore, it is preferable that the detector 8 is a temperature sensor. In the following, as an example, a case where the detector 8 is a temperature sensor will be described.

The controller 9 controls the operation of each element provided in the substrate treatment device 1. FIG. 2 illustrates an example of the configuration of the controller 9. The controller 9 can include, for example, a computational element such as a CPU (Central Processing Unit) and a memory 9c such as a semiconductor memory. The controller 9 can be, for example, a computer. For example, the mechanism controller 9a, the setting part 9b, and the removal ratio calculator (processing number of times calculator) 9d illustrated in FIG. 2 can be computational elements. The memory 9c can store a control program for controlling the operation of each element provided in the substrate treatment device 1, data on the relationship between the temperature at the start of freezing and the removal ratio of contaminations, and the like. The computational element controls operation of each element provided in the substrate treatment device 1 by using the includes a control program stored in the memory 9c, data input by the operator via the input/output screen (device) 12, data related to the relationship between the temperature at the start of freezing and the removal ratio of contaminations, the data of the number of cooling processes counted by the counter, the data from the detector 8, and the like.

The details of the data on the relationship between the temperature at the start of freezing and the removal ratio of contaminations will be described later.

The data input by the control program and the operator is set to the optimum state for being stored in the memory 9c (memory element) by the setting part 9b, and then stored in the memory element. Further, the setting part 9b reconverts the data requested to be output by the operator to the optimum state for displaying on the input/output screen, and displays the data on the input/output screen (device) 12.

Next, the operation of the substrate treatment device 1 will be illustrated.

Figure 3:
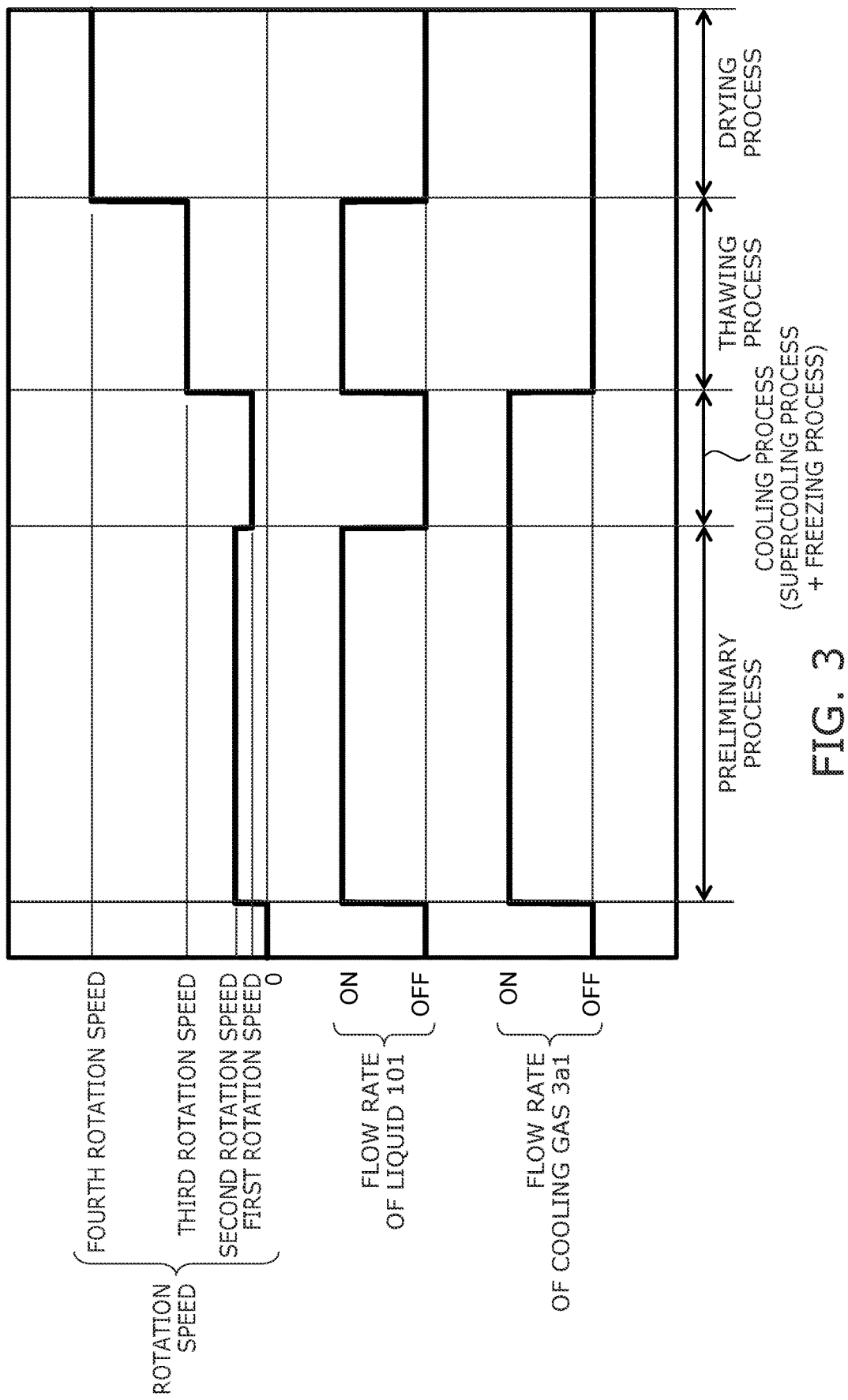
FIG. 3 is a timing chart for illustrating the operation of the substrate treatment device.

FIG. 3 is a timing chart for illustrating the operation of the substrate treatment device 1.

Figure 4:
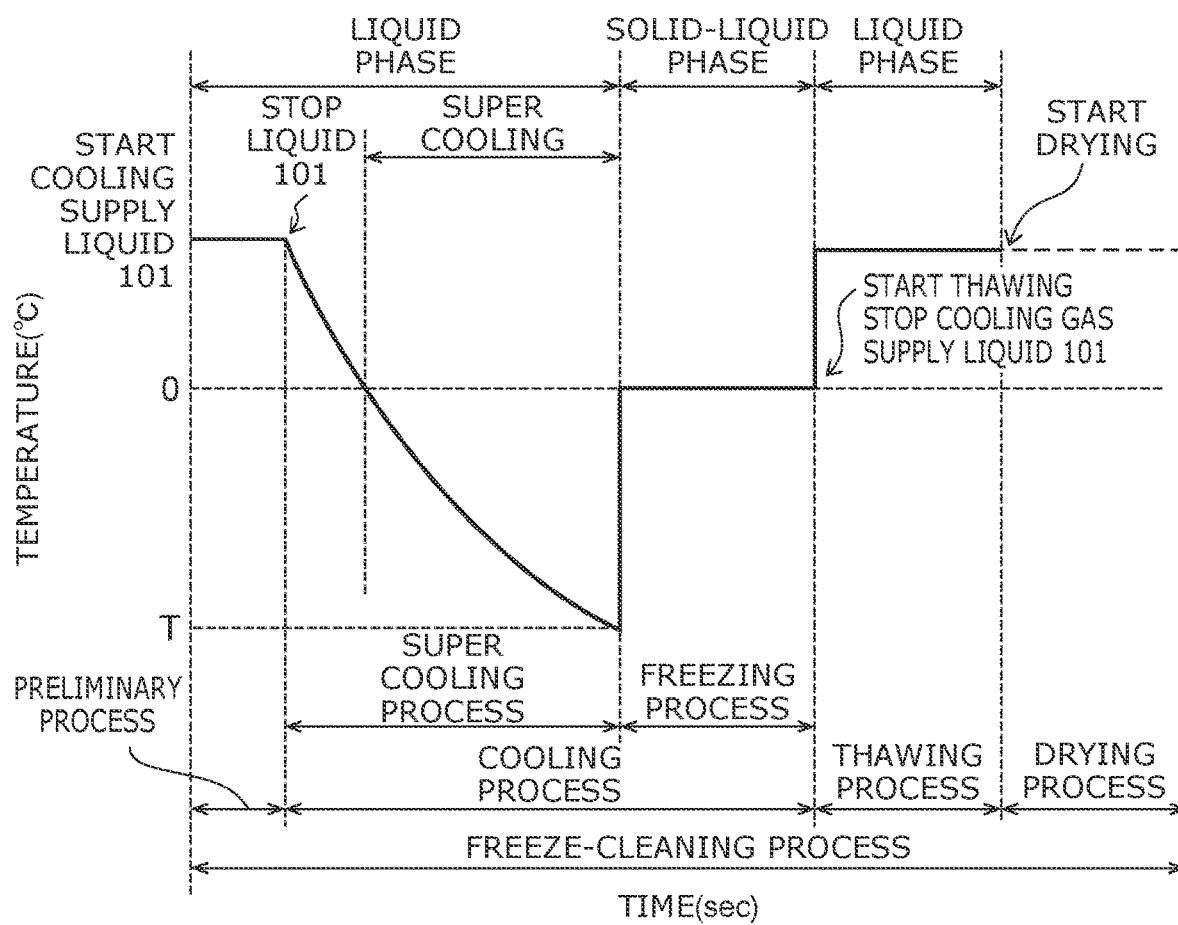
FIG. 4 is a graph for illustrating a temperature change of liquid supplied to the substrate in freeze cleaning process.

FIG. 4 is a graph for illustrating a temperature change of the liquid 101 supplied to the substrate 100 in the freeze-cleaning process.

FIGS. 3 and 4 show a case where the substrate 100 is a 6025 quartz (Qz) substrate (152 mm×152 mm×6.35 mm) and the liquid 101 is pure water.

First, the substrate 100 is carried into the inside of the housing 6 through a carry-in/carry-out port (not shown) of the housing 6. The carried-in substrate 100 is placed and supported on multiple support portions 2a1 of the placement stand 2a.

After the substrate 100 is supported by the placement stand 2a, a freeze cleaning process including a preliminary process, a cooling process (supercooling process+freezing process), a thawing process, and a drying process is performed as shown in FIG. 3.

First, the preliminary process is performed as shown in FIGS. 3 and 4. In the preliminary process, the controller 9 controls the supplier 4b and the flow rate controller 4c to supply the liquid 101 at a predetermined flow rate to the surface 100b of the substrate 100. Further, the controller 9 controls the flow rate controller 3c to supply the cooling gas 3a1 having a predetermined flow rate to the back surface 100a of the substrate 100. Further, the controller 9 controls the drive part 2c to rotate the substrate 100 at the second rotation speed.

Here, when the atmosphere inside the housing 6 is cooled by the supply of the cooling gas 3a1 by the cooling part 3, frost including dust in the atmosphere may adhere to the substrate 100 and cause contamination. In the preliminary process, since the liquid 101 is continuously supplied to the surface 100b of the substrate 100, it is possible to prevent the frost from adhering to the surface 100b of the substrate 100 while uniformly cooling the substrate 100.

For example, in the case of the one illustrated in FIG. 3, the rotation speed of the substrate 100 can be, for example, about 50 rpm to 500 rpm as the second rotation speed. The flow rate of the liquid 101 can be about 0.1 L/min to 1.0 L/min. The flow rate of the cooling gas 3a1 can be about 40 NL/min to 200 NL/min. In addition, the process time of the preliminary process can be set to about 1800 seconds. The process time of the preliminary process may be any time as long as the in-plane temperature of the substrate 100 becomes substantially uniform, and can be obtained by conducting experiments or simulations in advance.

The temperature of the liquid film in the preliminary process is substantially the same as the temperature of the supplied liquid 101 because the liquid 101 is in a flowing state. For example, when the temperature of the supplied liquid 101 is about room temperature (20° C.), the temperature of the liquid film is about room temperature (20° C.).

Next, as shown in FIGS. 3 and 4, the cooling process (supercooling process+freezing process) is executed. In the present embodiment, in the cooling process, the period between the time when the liquid 101 is in the supercooled state and the time before the freezing starts is called the "supercooling process", and the period between the time when the freezing of the liquid 101 in the supercooled state is started and the time until the freezing is completely completed is called the "freezing process". In the supercooling process, only the liquid 101 is present on the surface 100b of the substrate 100. In the freezing process, the liquid 101 and the frozen liquid 101 are present on the surface 100b of the substrate 100. The state in which the liquid 101 and the frozen liquid 101 are present as a whole is referred to as a "solid-liquid phase".

Here, if the cooling rate of the liquid 101 becomes too high, the liquid 101 does not become a supercooled state and freezes immediately. Therefore, the controller 9 controls at least one of the rotation speed of the substrate 100, the flow rate of the cooling gas 3a1, and the supply amount of the liquid 101, so that the liquid 101 on the surface 100b of the substrate 100 becomes supercooled.

In the cooling process (supercooling process+freezing process), as illustrated in FIG. 3, the supply of the liquid 101 supplied in the preliminary process is stopped after the first rotation speed is set. The first rotation speed is about 0 rpm to 50 rpm. The first rotation speed is such that the liquid 101 supplied from the supplier 4b spreads on the surface 100b of the substrate 100 to form a liquid film having a uniform thickness, and the liquid film having a uniform thickness is maintained. That is, the controller 9 rotates the substrate 100 at a rotation speed lower than the rotation speed at the time of the preliminary process. Further, the thickness of the liquid film of the liquid 101 at this time can be approximately 100 μm or more from the surface 100b of the substrate 100. Further, the flow rate of the cooling gas 3a1 is maintained at the same flow rate as in the preliminary process.

In this way, in the cooling process (supercooling process+freezing process), the liquid 101 on the substrate 100 is made to stagnate by stopping the supply of the liquid 101, and controlling the rotation speed of the substrate 100 to be set to the first rotation speed which is lower than the second rotation speed. Therefore, the temperature of the liquid film on the substrate 100 is further lowered from the temperature of the liquid film in the preliminary process due to the cooling gas 3a1 continuously supplied to the back surface 100a of the substrate 100, resulting in a supercooled state. The preliminary process may be carried out at the first rotation speed, and the supply of the liquid 101 may be stopped when the in-plane temperature of the substrate 100 becomes uniform.

The control conditions under which the liquid 101 is in the supercooled state are affected by the size of the substrate 100, the viscosity of the liquid 101, the specific heat of the cooling gas 3a1, and the like. Therefore, it is preferable to appropriately determine the control conditions for the liquid 101 to be in the supercooled state by conducting an experiment or a simulation.

In the supercooled state, freezing of the liquid 101 starts due to, for example, the temperature of the liquid film, the presence of bubbles and contaminations such as particles, and vibration. For example, in the presence of contaminations such as particles, freezing of the liquid 101 starts when the temperature T of the liquid 101 becomes not lower than −35° C. and not higher than −20° C. Further, freezing of the liquid 101 can be started by applying vibration to the liquid 101 by varying the rotation of the substrate 100.

When freezing of the liquid 101 in the supercooled state starts, the process shifts from the supercooling process to the freezing process. In the freezing process, the liquid film does not freeze in an instant. On the surface 100b of the substrate 100, the liquid 101 and the frozen liquid 101 are present. Latent heat is generated when the liquid 101 freezes. The temperature of the liquid film rises to the freezing point due to latent heat. The cooling gas 3a1 is supplied to the back surface 100a of the substrate 100. Therefore, the latent heat generation rate and the cooling rate are balanced, and the temperature is kept constant at a temperature slightly lower than the freezing point. When the liquid film is completely frozen and an ice film is formed, the generation of latent heat disappears. On the other hand, the supply of the cooling gas 3a1 to the back surface 100a of the substrate 100 is maintained. Therefore, when the ice film is formed, the temperature of the ice film begins to decrease.

Here, when the ice film continues to be cooled and the temperature of the ice film further decreases, the volume of the ice film is reduced. When the volume of the ice film is reduced, stress is generated in the ice film due to the difference in the coefficient of linear expansion between the ice film and the substrate 100. When the stress is generated in the ice film, the stress is transmitted to the surface 100b of the substrate 100 in contact with the ice film. Therefore, the fine uneven portion formed on the surface 100b of the substrate 100 may be damaged.

On the other hand, in the freezing process, since the liquid 101 exists around the frozen liquid 101, the volume change of the frozen liquid 101 is absorbed by the flow of the liquid 101. Therefore, the fine uneven portion formed on the surface 100b of the substrate 100 is not easily damaged.

Next, the thawing process is performed as shown in FIGS. 3 and 4. In addition, FIGS. 3 and 4 illustrate a case where the liquid 101 and the liquid 102 are the same liquid. Therefore, it is described as liquid 101 in FIGS. 3 and 4. In the thawing process, the controller 9 controls the supplier 4b and the flow rate controller 4c to supply the liquid 101 at a predetermined flow rate to the surface 100b of the substrate 100. When the liquid 101 and the liquid 102 are different, the controller 9 controls the supplier 5b and the flow rate controller 5c to supply the liquid 102 at a predetermined flow rate to the surface 100b of the substrate 100.

Further, the controller 9 controls the flow rate controller 3c to stop the supply of the cooling gas 3a1. Further, the controller 9 controls the drive part 2c to increase the rotation speed of the substrate 100 to the third rotation speed. The third rotation speed can be, for example, about 200 rpm to 700 rpm. If the rotation of the substrate 100 becomes faster, the liquid 101 and the frozen liquid 101 can be shaken off by centrifugal force. Therefore, the liquid 101 and the frozen liquid 101 can be discharged from the surface 100b of the substrate 100. At this time, the contaminations separated from the surface 100b of the substrate 100 are also discharged together with the liquid 101 and the frozen liquid 101.

The supply amount of the liquid 101 or the liquid 102 is not particularly limited as long as it can be thawed. Further, the third rotation speed of the substrate 100 is not particularly limited as long as the liquid 101, the frozen liquid 101, and the contaminations can be discharged.

Next, the drying process is performed as shown in FIGS. 3 and 4. In the drying process, the controller 9 controls the supplier 4b and the flow rate controller 4c to stop the supply of the liquid 101. When the liquid 101 and the liquid 102 are different liquids, the controller 9 controls the supplier 5b and the flow rate controller 5c to stop the supply of the liquid 102.

Further, the controller 9 controls the drive part 2c to increase the rotation speed of the substrate 100 to a fourth rotation speed faster than the third rotation speed. If the rotation of the substrate 100 becomes faster, the substrate 100 can be dried quickly. The fourth rotation speed of the substrate 100 is not particularly limited as long as the substrate 100 can be dried.

The substrate 100 that has been freeze-cleaned is carried out of the housing 6 through a carry-in/carry-out port (not shown) of the housing 6.

By doing the above, one freeze-cleaning process can be performed.

The thawing process described above can be started during the freezing process in the cooling process. The start of freezing of the supercooled liquid 101 is detected by the detector 8. As a result, after the liquid film has started freezing, thawing can be started by the time it is completely frozen. That is, since the liquid 101 on the substrate 100 can be thawed in the solid-liquid phase state, it is possible to suppress damage to the fine uneven portions formed on the surface 100b of the substrate 100.

Note that the timing of the start of thawing can include the moment when everything freezes at the end of the solid-liquid phase state and the time of several seconds thereafter. As described above, the time until the entire surface of the substrate freezes, that is, the time during which the solid-liquid phase state remains in a part thereof can be included.

By the way, as described above, not all liquids are changed to solids in the freezing process. Also, not all solids have their origins in contaminations. Therefore, it is preferable to perform the freeze-cleaning process multiple times.

If the next freeze-cleaning process is carried out, it is not necessary to completely dry the surface 100b of the substrate 100 in the drying process of the currently performed freeze-cleaning process (the current freeze-cleaning process). Further, after the liquid 101, the frozen liquid 101, and the contaminations are discharged in the thawing process, the supply of the cooling gas 3a1 is started to start the preliminary process. In the thawing process, the substrate 100 shifts from a temperature below room temperature to a preliminary process, so that the preliminary process of the next freeze-cleaning process can shorten the processing time. That is, if the next freeze-cleaning process is carried out, the drying process of the current freeze-cleaning process can be omitted, and the processing time of the preliminary process of the next freeze-washing process can be shortened.

For example, when the freeze-cleaning process is performed multiple times, the second and subsequent freeze-cleaning processes suffice to include at least a preliminary process, a supercooling process of supercooling the liquid 101 on the surface 100b of the substrate 100, a freezing process in which the liquid 101 and the frozen liquid 101 are present, and a thawing process in which the frozen liquid 101 is thawed.

Further, when the freeze-cleaning process is performed multiple times, the controller 9 can also maintain the supply of the cooling gas 3a1 during the thawing process. By maintaining the supply of cooling gas even in the thawing process, the same state as in the preliminary process can be created. That is, it is possible to simultaneously thaw the frozen liquid 101 and pre-cool the substrate. By doing so, it is possible to combine the thawing process and the next preliminary process, and the tact time can be further shortened.

As described above, it is considered that in freeze-cleaning, contaminations adhering to the surface of the substrate 100 are separated by a pressure wave accompanying a volume change when the liquid changes to a solid, a physical force accompanying the volume increase, and the like.

Specifically, it is considered that the liquid 101 in the supercooled state starts freezing starting from the contaminations adhering to the surface of the substrate 100. At that time, the liquid 101 around the contaminations freezes. At this time, since the surroundings of the contaminations covered with the frozen liquid 101 are still liquid, the physical force obtained by freezing the liquid 101 between the substrate 100 and the contaminations and expanding the volume works as a force to pull the contaminations away from the substrate.

Therefore, in the freezing process in which freezing starts from the supercooled state, it is considered that the ratio of the frozen liquid 101 to the removal ratio of contaminations is proportional. That is, it is considered that as the ratio of the liquid change into the solid is higher, the more the contaminations are separated.

When the contaminations covered with the frozen liquid 101 is completely separated from the substrate 100, the liquid 101 flows in the space between the contaminations covered with the frozen liquid 101 and the substrate 100. Therefore, the physical force associated with the volume increase when the liquid 101 is frozen is not transmitted to the substrate 100 when the contaminations covered with the frozen liquid 101 are completely separated from the substrate 100. Therefore, the fine uneven portion formed on the surface 100b of the substrate 100 is not easily damaged.

Figure 5:
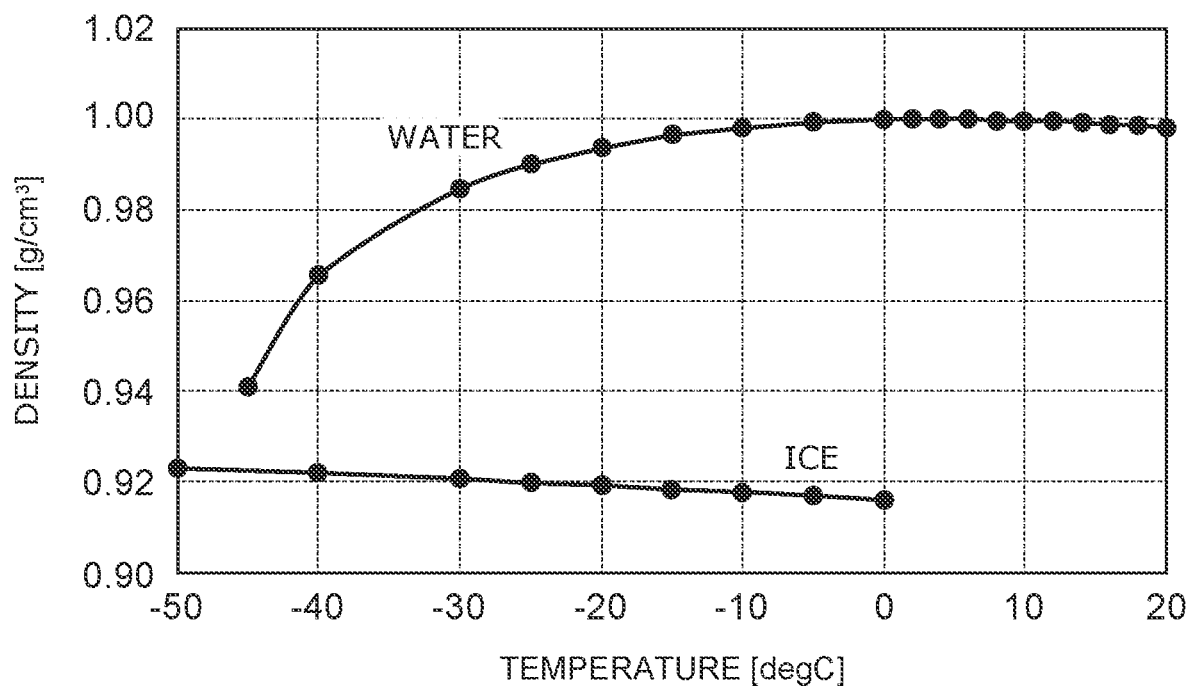
FIG. 5 is a graph for illustrating a relationship between the temperature and the density of water in liquid and a relationship between the temperature and the density of water in solid.

FIG. 5 is a graph for illustrating the relationship between temperature and density of liquid water and the relationship between temperature and density of solid water.

FIG. 5 shows the density change of water and ice from 20° C. to −50° C. This is a plot based on the values of JR Rumble, [CRC Handbook of Chemistry and Physics], Tayler & Francis, London, 99th ed., 6-7, 6-12 (2018).

The density of water is maximum at 4° C. and lower on both the hot and cold sides. The density of ice increases as the temperature decreases from 0° C. Water below 0° C. is supercooled water, but as can be seen from FIG. 5, the density changes smoothly from water to supercooled water. The volume change from 0° C. to −40° C. is about 3.4% for water and about 0.5% for ice.

Figure 6:
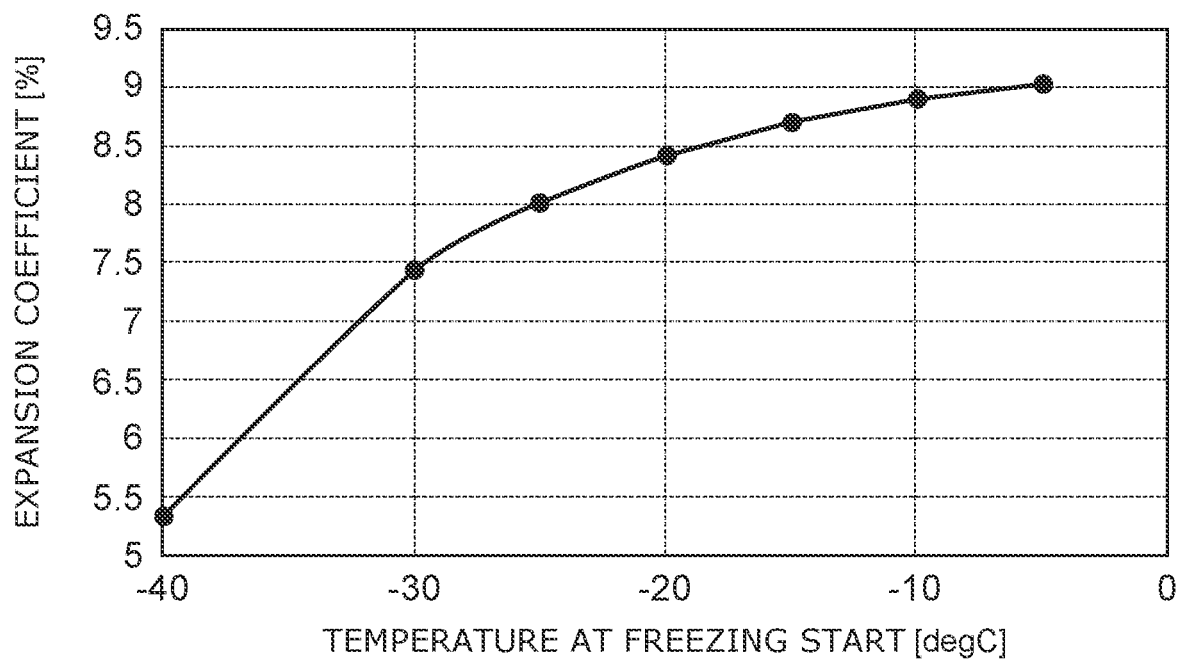
FIG. 6 is a graph for illustrating a relationship between the expansion coefficient and the temperature of the water at start of freezing from supercooled state.

FIG. 6 is a graph for illustrating the relationship between the expansion coefficient and the temperature of the water at start of freezing from supercooled state.

FIG. 6 shows the result of estimating the volume change when the supercooled water is considered to become ice at 0° C. As can be seen from FIG. 6, when the supercooled water becomes ice at 0° C., the volume increases by about 5.3% to 9.1% as compared with the original water. This volume change acts to lift contaminations. The lower the supercooling, the smaller the volume change, but still maintain a change of more than 5%, which is considered to be sufficient to lift contaminations.

Here, according to the knowledge obtained by the inventors, it has been found that the ratio of the liquid change into the solid varies in the freezing process. The higher the ratio of the liquid change into the solid, the easier it is for the contaminations to be separated. Therefore, when the ratio of the liquid change into the solid varies, the separation amount of the contaminations varies, and thus it is considered that the removal ratio of the contaminations varies. Therefore, when the freeze-cleaning process is repeated, if the freeze-cleaning process is performed a predetermined number of times without considering the variation of the ratio of the liquid change into the solid, contaminations may remain or excessive washing may be performed.

The inventors conducted a research study on the cause of variation in the ratio of the liquid change into the solid in the freezing process. As a result, it was found that when the temperature T (see FIG. 4) at the start of freezing of the supercooled liquid 101 varies, the ratio of the liquid change into the solid varies in the freezing process. In this case, if the temperature T at the start of freezing of the supercooled liquid 101 can be stabilized, the freeze-cleaning process can be performed a predetermined number of times. However, the start of freezing of the supercooled liquid 101 is affected by the density change due to the non-uniform temperature of the liquid film, the presence of bubbles and contaminations such as particles, and vibration. Therefore, it is difficult to stabilize the temperature T at the start of freezing of the supercooled liquid 101.

Therefore, the inventors found that the ratio of the liquid change into the solid can be obtained in the freezing process, if the temperature T at the start of freezing of the supercooled liquid 101 can be detected, because there is a correlation between the temperature T at the start of freezing of the supercooled liquid 101 and the ratio of the liquid change into the solid.

Here, when the supercooled liquid 101 starts freezing, the temperature rises due to latent heat. Therefore, as shown in FIG. 4, the temperature T at the start of freezing can be set to the temperature at which the temperature of the supercooled liquid 101 begins to rise. Further, when the temperature of the supercooled liquid 101 starts to rise, it is the timing when the supercooled liquid 101 starts to freeze.

When the supercooled liquid 101 starts freezing, freezing starts almost at the same time on the entire surface of the substrate 100. However, the freezing start time may be slightly off. For this reason, if thawing is started at the same time as the temperature rises due to latent heat, there is a possibility that there will be places where freezing has not started starting from contaminations. When a short time has elapsed after the start of freezing, a portion where the thawing has not started will start to freeze. Therefore, it is preferable that the thawing is performed after the short time has elapsed from the start of freezing. For example, it is preferable to delay the temperature by about 0.2 to 2.0 seconds after the temperature rises due to latent heat. However, when the liquid film is thin, there is almost no time for the freezing process, and all of the ice film may soon become frozen. At this time, as described above, stress is generated between the ice film and the surface of the substrate 100, which may damage fine unevenness. According to the knowledge obtained by the inventors, if the thickness of the liquid film is 100 μm or more, the time from the start of freezing to the formation of an ice film can be maintained for a required time.

By the way, if the detector 8 is a temperature sensor, the temperature T at the start of freezing can be directly detected. Further, the liquid 101 becomes cloudy by changing the phase from the supercooled liquid 101 to the solid-liquid phase liquid 101. Therefore, the reflectance and the refractive index of the liquid 101 on the substrate 100 change. Therefore, the refractive index meter, the laser displacement meter, the image processing device, or the like can be used as the detector 8. When the detector 8 is the refractive index meter, the laser displacement meter, the image processing device, or the like, the detected value may be converted into the temperature T at the start of freezing in accordance with the correlation with the freezing start temperature obtained in advance.

Next, the correlation between the temperature T at the start of freezing, the ratio of liquid and solid, and the removal of contaminations will be described.

The temperature at which the liquid freezes from the supercooled state (temperature T at the start of freezing) varies depending on the conditions, but when it starts to freeze at a certain trigger, the entire system freezes at once. When freezing, the entire system becomes water and ice at 0° C., so the amount of ice (ratio of liquid to solid) to the original water, assuming this change is an adiabatic process, can be predicted by considering that the amount of heat taken up until the temperature of the end of overcooling of water at 0° C. is reached is equal to the amount of heat generated and released by ice at 0° C.

Figure 7:
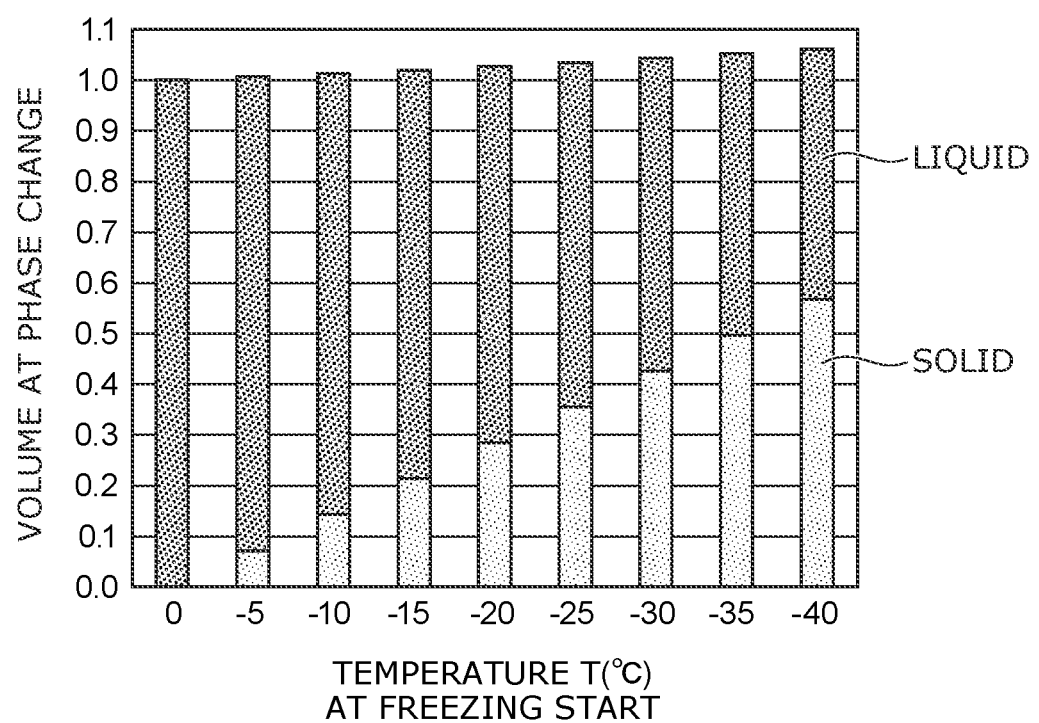
FIG. 7 is a graph for illustrating a relationship between the temperature at start of freezing and the ratio of liquid to solid.

FIG. 7 is a graph for illustrating the relationship between the temperature T at the start of freezing and the ratio of liquid to solid.

As can be seen from FIG. 7, as the temperature T at the start of freezing decreases, the ratio of solids in the freezing process increases. As mentioned above, there is a positive correlation between the ratio of solids in the freezing process and the removal ratio of contaminations. For example, it is considered that the higher the ratio of solids, the more contaminations can be removed, and thus the contamination removal ratio is higher. In addition to contaminations, the starting point of freezing may be a change in density due to non-uniform temperature, a change due to minute vibration of the surface, bubbles in the liquid 101, or the like. Therefore, the ratio of solids and the removal ratio of contaminations are not always the same. The relationship between the ratio of solids and the removal ratio of contaminations can be obtained by conducting experiments and simulations in advance.

Next, the correlation between the ratio of change from liquid to solid and the removal of contaminations (removal ratio) will be described.

Here, the contamination removal ratio (PRE) can be expressed by the following formula when the number of contaminations before the cleaning treatment is NI and the number of contaminations after the cleaning treatment is NP.

$$\text{PRE } (\%) = ((NI - NP)/NI) \times 100 \qquad (1)$$

Therefore, if the temperature T at the start of freezing is known, the ratio of solids in the freezing process, and in addition, the removal ratio (PRE) of contaminations in the current freeze-cleaning process can be obtained. If the removal ratio of contaminations in the current freeze-cleaning process is known, the freeze-cleaning process may be repeated until the removal ratio of contaminations on the substrate 100 reaches a predetermined value. For example, the freeze-cleaning process can be repeated until the removal ratio of contaminations on the substrate 100 reaches 90%. The target removal ratio (predetermined removal ratio) may be set so that the yield in cleaning the substrate 100 becomes an acceptable value.

FIG. 8 is a table for illustrating the relationship between the temperature T at start of freezing and the number of times of freeze cleaning process.

In FIG. 8, as an example, the ratio of solids in the freezing process illustrated in FIG. 7 and the removal ratio of contaminations are equalized. That is, it is assumed that the freezing of the liquid 101 is originated from contamination. Further, in each repeated freeze-cleaning process, the temperature T at the start of freezing is assumed to be constant.

FIG. 8 shows the temperature at which the liquid 101 starts freezing from the supercooled state in the row of the table, below that, the removal ratio of contaminations at each freezing temperature, and below that, the removal ratio of the contamination from the initial state for each repeated cleaning treatment.

For example, when the freezing start temperature is −30° C., the removal ratio is 39.3%, which indicates that 39.3% of contaminations are removed by one cleaning treatment. With 2 cleaning treatments, it becomes (100−39.3)×0.393+ 39.3=63.2(%), with 3 cleaning treatments, (100−63.2)× 0.393+63.2=77.6.

As can be seen from FIG. 8, when the temperature T at the start of freezing changes, the removal ratio obtained from the ratio of the change from the liquid to the solid in advance changes. Therefore, based on the temperature T detected by the detector 8, the removal ratio at the temperature T can be taken out from the memory 9c, and the number of freeze-cleaning processes until a predetermined removal ratio of contaminations is reached can be obtained. For example, in the case of the example shown in FIG. 8, when the temperature T at the start of freezing is −25° C., the number of freeze-cleaning processes can be 20 or more. When the temperature T at the start of freezing is −30° C., the number of freeze-cleaning processes can be 16 or more. As described above, the number of times may be appropriately determined within a range in which an acceptable cleaning yield can be obtained.

In this way, the number of times that the freeze-cleaning process is performed can be determined in advance to perform the cleaning treatment. In a relatively short period of time, the temperature of the liquid film, the presence bubbles and of contaminations such as particles, vibration and the like are stable, and the temperature T at the start of freezing may be stable. In such a case, the temperature T at the start of freezing can be detected during the first freeze-cleaning process, and the number of freeze-cleaning processes can be set.

The memory 9c of the controller 9 stores data corresponding to the table shown in FIG. 8 as data relating to the relationship between the temperature at the start of freezing and the removal ratio of contaminations. The memory 9c of the controller 9 may store only the data associated with the temperature T at the start of freezing and the removal ratio obtained in advance from the ratio of the liquid change into the solid at the temperature T at the start of freezing. Further, the difference from the actual removal ratio of contaminations obtained by experiments or the like may be corrected. In that case, the corrected data may be stored. Further, not only the data may be stored, but also the data may be stored as an approximate formula and used for the calculation.

As described above, the temperature T at the start of freezing is affected by the density change due to the non-uniform temperature of the liquid film, the presence of bubbles and contaminations such as particles, vibration, etc., and therefore the temperature T often differs for every freeze-cleaning process. Therefore, it is preferable to detect the temperature T at the start of freezing in each freeze-cleaning process and obtain the removal ratio of contaminations in the current freeze-cleaning process. Therefore, the number of freeze-cleaning processes differs for each substrate 100.

In this case, the memory 9c of the controller 9 stores the removal ratio calculated in each freeze-cleaning process every time the freeze-cleaning process is performed. First, from the temperature T detected by the detector 8 and the table shown in FIG. 8, the value of the removal ratio at the temperature T is calculated. Next, the value of the removal ratio obtained in processes up to the previous freeze-cleaning process is read from the memory 9c of the controller 9. The removal ratio obtained in processes up to the current freeze-cleaning process is obtained from the calculated removal ratio and the read removal ratio.

Here, in the case where the removal ratio obtained in processes up to the freeze-cleaning process immediately before the current freeze-cleaning process is taken as $PRE_{n-1}$, the removal ratio of contaminations at the freezing start temperature in the current freeze-cleaning process is taken as $PRE_c$, the removal ratio ($PRE_n$) obtained in processes up to the current freeze-cleaning process can be shown by the following approximate formula.

$$PRE_n(\%) = (100 - PRE_{n-1}) \times PRE_c + PRE_{n-1} \quad (2)$$

For example, it is assumed that the freezing start temperature in the first freeze-cleaning process is −30° C., the freezing start temperature in the second freeze-cleaning process is −35° C., and the freezing start temperature in the third freeze-cleaning process is −40° C. (see FIG. 8 for the removal ratio ($PRE_c$) of contaminations at the respective freezing start temperatures).

The removal ratio in the first freeze-cleaning process:

$$(100-0) \times 0.393 + 0 = 39.3(\%)$$

The removal ratio obtained in processes up to the second freeze-cleaning process:

$$(100-39.3) \times 0.4585 + 39.3 = 67.1(\%)$$

The removal ratio obtained in processes up to the third freeze-cleaning process:

$$(100-67.1) \times 0.524 + 67.1 = 84.3(\%)$$

In addition, the number of freeze-cleaning process may exceed a predetermined range. In such a case, the substrate 100 can be carried out of the substrate treatment device 1 on the assumption that an abnormality has occurred. In this case, the removal ratio, the number of freeze-cleaning processes, the temperature T at the start of freezing, and the like can be transmitted to an external device as the data of the carried-out substrate 100.

Further, even when the temperature T at the start of freezing is stable in a relatively short period of time, the temperature T at the start of freezing may be detected every predetermined times, and the number of freeze-cleaning processes may be set.

When the removal ratio of contaminations reaches a predetermined value (for example, 90% or more) by repeating the freeze-cleaning process, the substrate 100 can be carried out of the housing 6 through a carry-in/carry-out port (not shown) of the housing 6.

Figure 9:
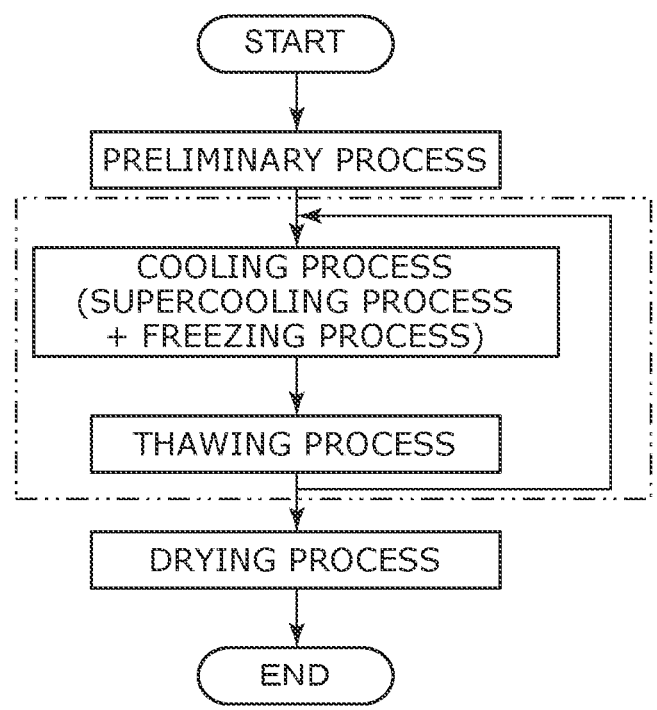
FIG. 9 is a flow chart of freeze cleaning process.

FIG. 9 is a flowchart of the freeze-cleaning process. Since the contents of the flowchart of FIG. 9 can be the same as those described above, the description of the contents will be omitted.

Figure 10:
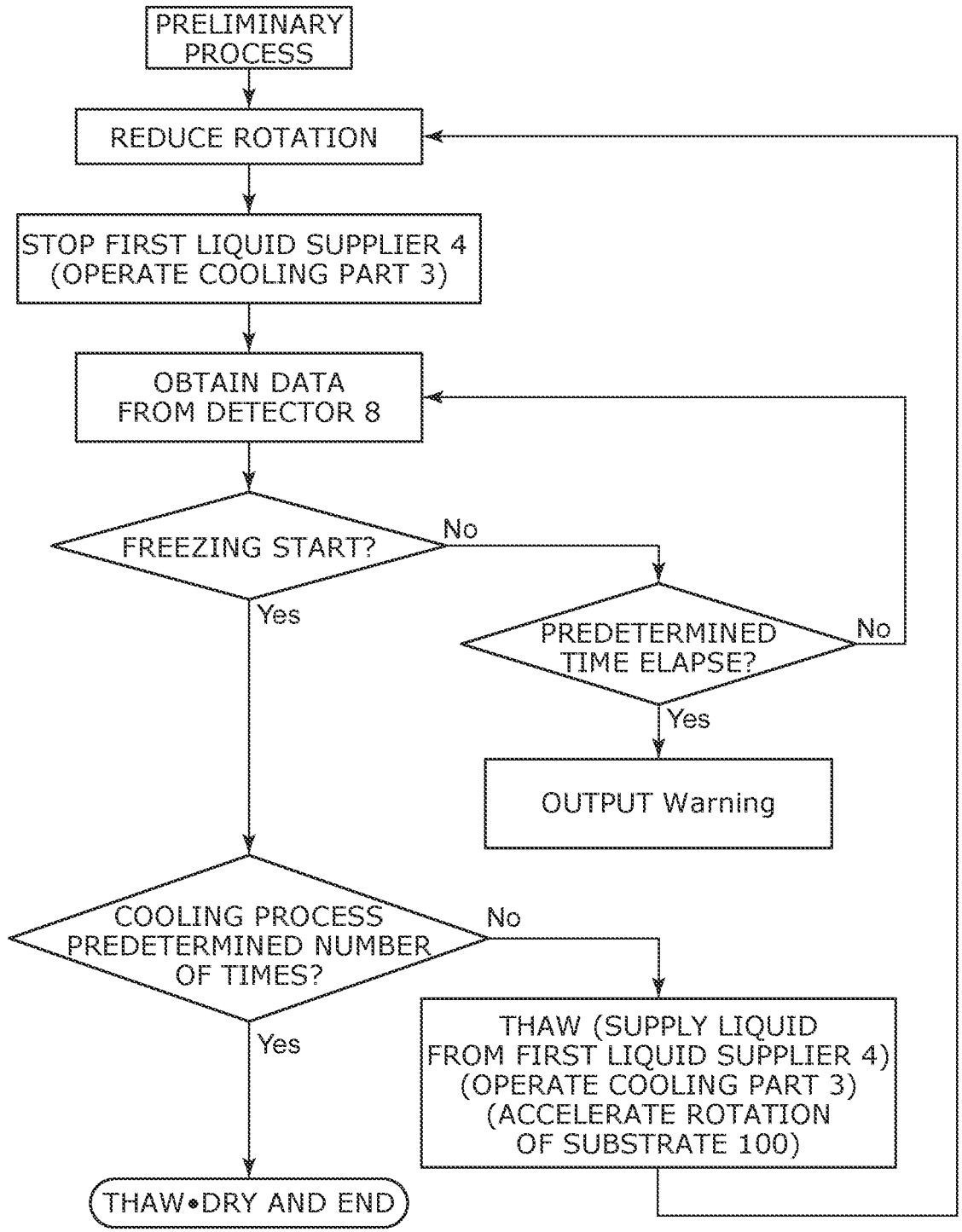
FIG. 10 is a flowchart of cooling process and thawing process in the case of performing freeze cleaning process repetitively.
Figure 11:
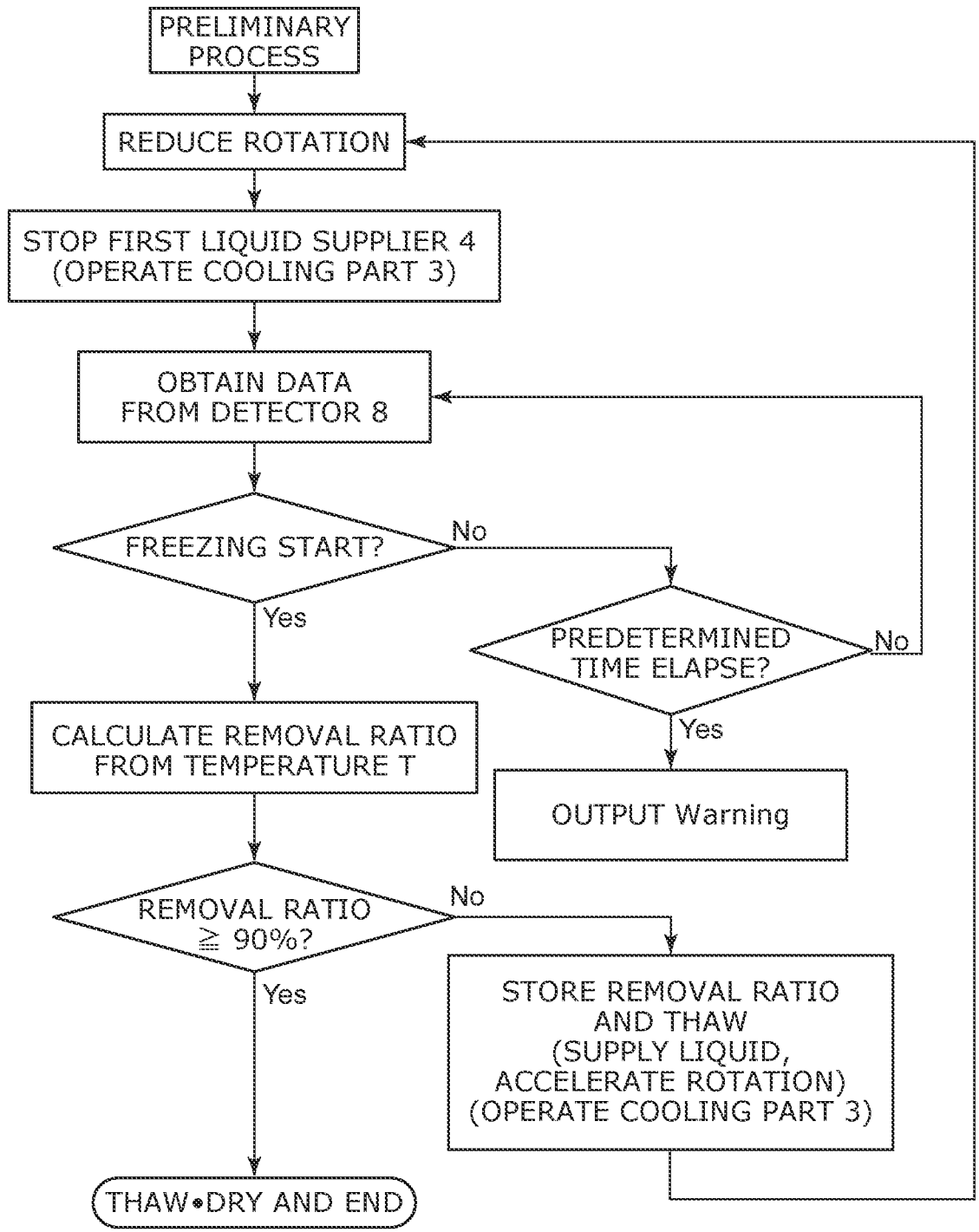
FIG. 11 is a flowchart of cooling process and thawing process in the case of performing freeze cleaning process repetitively.
Figure 12:
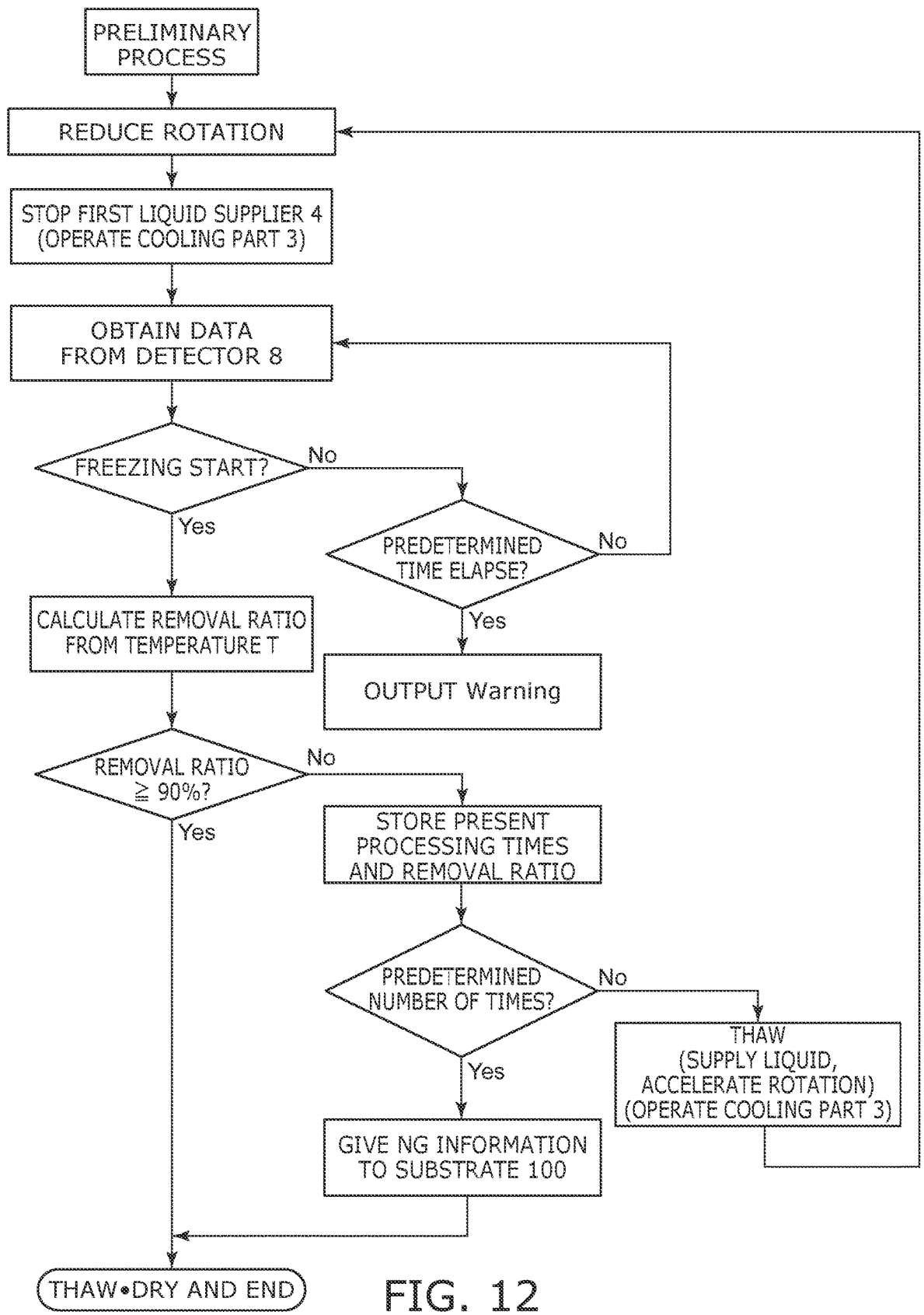
FIG. 12 is a flowchart of cooling process and thawing process in the case of performing freeze cleaning process repetitively.

FIG. 10 to 12 are flowcharts showing the parts of the cooling process and the thawing process in more detail in the flowchart of the freeze-cleaning process of FIG. 9.

FIG. 10 shows a case where the number of cooling processes is determined in advance. FIG. 11 shows a case where a predetermined limit is not set on the number of cooling processes. FIG. 12 shows a case where a predetermined limit is set on the number of freeze-cleaning processes.

As shown in FIG. 10, when the number of cooling processes is determined in advance, the memory 9c of the controller 9 stores information on the freezing start temperature T in advance. The controller 9 calculates the number of times the contamination removal ratio becomes, for example, 90% from the input temperature T, and stores the number of times in the memory.

After the preliminary process, as shown in FIG. 10, the supply of the supplied liquid 101 is stopped. After that, the rotation speed of the substrate 100 is set to about 0 rpm to 50 rpm, and the thickness of the liquid film of the liquid 101 is set to a desired thickness. The flow rate of the cooling gas 3a1 is maintained at the same supply amount as in the preliminary process.

When the thickness of the liquid film of the liquid 101 is set to a desired thickness, the detector 8 detects the temperature of the liquid film. At this time, if the temperature rise due to latent heat is detected, the controller 9 calculates the number of cooling processes. The controller 9 has a counter (not shown) that counts the number of cooling processes, and the counter sends information on the number of times to the calculation element of the controller. The calculation element determines whether or not the number of times from the counter is a predetermined number of times. If it is not a predetermined number of times, thawing is performed while the cooling part 3 is operating. Specifically, the liquid 101 is supplied from the first liquid supplier 4. When the thawing is completed, the liquid 101 of the first liquid supplier 4 is stopped, the liquid film is made to a desired thickness again, and then the detector 8 is used to detect and determine whether or not the liquid film has started freezing. If the detector 8 cannot detect the temperature rise due to latent heat even after a lapse of a predetermined time, there is a possibility that freezing has started without going through the supercooled state. In this case, the substrate treatment device 1 issues a warning and stops the device.

By doing so, the freezing process can be detected by the detector 8, so that the liquid 101 on the substrate 100 can always be thawed in the solid-liquid phase state. Therefore, it is possible to suppress damage to the unevenness formed on the surface of the substrate. Further, by obtaining in advance the freezing start temperature and the removal ratio at that temperature from the data on the relationship between the temperature at the start of freezing and the removal ratio of contaminations as shown in FIG. 8, the number of times that the high removal ratio of contaminations can be obtained can be easily determined. Therefore, since it is possible to prevent the freeze-cleaning process from being carried out more than a necessary number of times, it is possible to shorten the tact time while improving the removal ratio of contaminations. This method is preferable when the freezing start temperature is stable.

As shown in FIG. 11, when the number of cooling processes is not limited, the controller 9 reads out the removal ratio ($PRE_c$) at the temperature T at the start of freezing from the memory 9c based on the temperature T at the start of freezing detected by the detector 8. The removal ratio of the current freeze-cleaning process is calculated from the removal ratio ($PRE_c$) read out by the controller 9 and the removal ratio ($PRE_{n-1}$) obtained in processes 120 up to the freeze-cleaning process immediately before the current freeze-cleaning process.

Specifically, after the preliminary process, it is the same as the case where the number of cooling processes is determined in advance up to the time when the thickness of the liquid film of the liquid 101 is set to a desired thickness, and the detector 8 detects the temperature of the liquid film. After that, when the detector 8 detects the temperature rise due to the latent heat, the detector 8 sends information of the temperature rise to the controller 9 as the temperature T at the start of freezing. The controller 9 reads out the acquired value of the removal ratio at the temperature T at the start of freezing from the memory 9c. Then, the removal ratio obtained in processes up to the current freeze-cleaning is calculated from the removal ratio read from the memory 9c and the removal ratio obtained in processes up to the freeze-cleaning process immediately before the current freeze-cleaning process. Next, the controller 9 determines whether or not the calculated removal ratio is a predetermined value (for example, 90% or more). When the calculated removal ratio is higher than 90%, the supply of the cooling gas 3a1 of the cooling part 3 is stopped, and the process proceeds to the thawing process. When the calculated removal ratio is lower than 90%, the removal ratio obtained in processes up to the current freeze-cleaning process is stored in the memory 9c, and thawing is performed while the cooling part 3 is operating. Specifically, the liquid 101 is supplied from the first liquid supplier 4. When the thawing is completed, the supply of the liquid 101 of the first liquid supplier 4 is stopped, the liquid film is made to have a desired thickness again, and then the detector 8 is used to determine whether or not the liquid film has started freezing.

Since the start of freezing is detected by doing so, the liquid 101 on the substrate 100 can always be thawed in the solid-liquid phase state. Further, even if freezing starts at a temperature higher than the assumed freezing start temperature in the current freeze-cleaning process, the removal ratio at that temperature is read from the memory 9c of the controller 9, and the removal ratio obtained in processes up to the current freezing-cleaning process can be recalculated. Therefore, even if the freezing start temperature is not stable, a high value of the removal ratio of contaminations can be maintained after all the freezing-cleaning processes have been performed. As a result, the removal ratio of contaminations for each substrate 100 is stable.

If the number of cooling processes is not limited, and if the temperature T at the start of freezing is frequently higher than as expected, the removal ratio may not exceed 90% even if the number of cooling processes will be twice or three times as expected. Alternatively, it may be that although the removal ratio is 90% or more, the time required for repeating the freeze-cleaning process may be twice or three times as expected. In this case, as shown in FIG. 12, when the number of freeze-cleaning processes exceeds a predetermined range, the substrate 100 is carried out of the substrate treatment device 1 on the assumption that an abnormality has occurred. Data such as the removal ratio, the number of freeze-cleaning processes, and the temperature T at the start of freezing for the carried-out substrate 100 are transmitted to an external device.

In this case, the controller 9 stores the data about the substrate 100 accumulated up to a predetermined number of treatments of the freeze-cleaning process in the memory 9c. It is the same as the case where a predetermined limit is not set on the number of times of the cooling process up to the point where the controller 9 calculates the removal ratio obtained in processes up to the current freeze-cleaning process from the removal ratio at the temperature T at the start of freezing and the removal ratio obtained in processes up to the freeze-cleaning process immediately before the current freeze-cleaning process.

The controller 9 determines whether or not the calculated removal ratio is 90% or more. When the calculated removal ratio is higher than 90%, the process proceeds to the thawing process and the cleaning treatment is completed with the supply of the cooling gas 3a1 of the cooling part 3 stopped.

When the calculated removal ratio is lower than 90%, the memory 9c stores the removal ratio obtained in processes up to the current freeze-cleaning process. and the number of times of the current freeze-cleaning process. Next, it is determined whether the number of times stored is the predetermined number of times stored in advance. If the number of processes is different from the predetermined number of times, thawing is performed while the cooling part 3 is operating. Specifically, the liquid 101 is supplied from the first liquid supplier 4. When the thawing is completed, the supply of the liquid 101 of the first liquid supplier 4 is stopped, the liquid film is made to have a desired thickness again, and then the detector 8 is used to determine whether or not the liquid film has started freezing. When the number of processing times is predetermined, the substrate 100 is carried out of the substrate treatment device 1. At this time, data such as the removal ratio of contaminations, the number of freeze-cleaning processes, and the temperature T at the start of freezing for the carried-out substrate 100 are also transmitted to the external device.

Since the start of freezing is detected by doing so, the liquid 101 on the substrate 100 can always be thawed in the solid-liquid phase state. Further, even if an abnormality occurs during the cleaning treatment, the next substrate process can be performed without stopping the device. Further, since the data of the substrate 100 is transmitted to the external device by the controller 9, the history can be tracked.

When determining the number of cooling processes in advance and determining whether the removal ratio of contaminants is 90% or more, the controller 9 operates in the same manner as described above. For example, the predetermined number of treatments may be a predetermined number of cooling processes. In this case, if the calculated removal ratio is lower than 90% even if the number of predetermined cooling processes is reached, the substrate 100 is carried out of the substrate treatment device 1 and carried out in the same manner as described above. Data such as the removal ratio of contaminants, the number of freeze-cleaning processes, and the temperature T at the start of freezing for the carried out substrate 100 may be transmitted to an external device. Further, the freeze-cleaning process may be repeated a predetermined number of times without carrying the substrate 100 out of the substrate treatment device 1.

By doing so, the liquid 101 on the substrate 100 can always be thawed in the solid-liquid phase state. Further, even when an abnormality occurs, it is possible to select whether to process the next substrate or perform an additional freeze-cleaning process without stopping the device. Further, since the data of the substrate 100 is transmitted to the external device by the controller 9, the history can be tracked.

Figure 13:
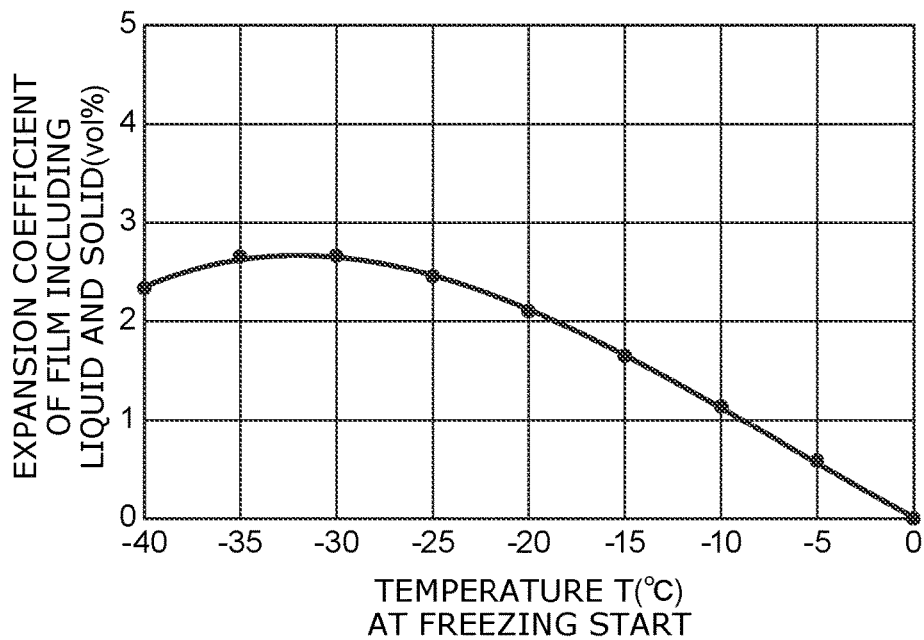
FIG. 13 is a graph for illustrating the temperature at start of freeze cleaning process and the expansion coefficient of a film including liquid and solid in freezing process.

FIG. 13 is a graph for illustrating the relationship between the temperature T at the start of freezing and the expansion coefficient of the film including the liquid 101 and the solid in the freezing process.

In the freezing process, if the expansion coefficient of the film including the liquid 101 and the solid increases, the generated pressure wave and physical force increase, so that the removal ratio of contaminations can be improved.

As can be seen from FIG. 13, if the temperature T at the start of freezing is not lower than −40° C. and not higher than −20° C., the expansion coefficient of the film can be increased, so that the removal ratio of contaminations can be improved. As described above, the temperature T at the start of freezing variates due to the influence of density change of the liquid film due to non-uniform temperature, the presence of bubbles and contaminations such as particles, and vibration or the like. However, the temperature of the liquid film can be controlled to some extent by controlling at least one of the rotation speed of the substrate 100, the flow rate of the cooling gas 3a1, and the supply amount of the liquid 101. Therefore, the controller 9 controls at least one of the rotation speed of the substrate 100, the flow rate of the cooling gas 3a1, and the supply amount of the liquid 101, so that the temperature T at the start of freezing can be not lower than −40° C. and not higher than −20° C.

Next, the results of the actual experiment are shown.

As the sample, for the above-mentioned substrate 100, a 6025 quartz (Qz) substrate (152 mm×152 mm×6.35 mm) was used, and for the liquid 101, pure water was used.

As the contamination, a polystyrene-based latex (PSL) solution (manufactured by Thermo Scientific, model 3080A) having a particle size of 80 nm was sprayed on the substrate 100 and dried. As the PSL solution, a solution whose concentration was adjusted so that the number of PSLs adhered on the substrate was 10,000±10% was used, and Magics M-2350 manufactured by Lasertech was used for the measurement of contaminations.

In the experiment, thawing is performed in the freezing process of the cooling process, and the removal ratio of each contamination was measured when the cooling process was repeated 10, 30, and 60 times. The thickness of the liquid film was adjusted to about 280 μm.

Figure 14:
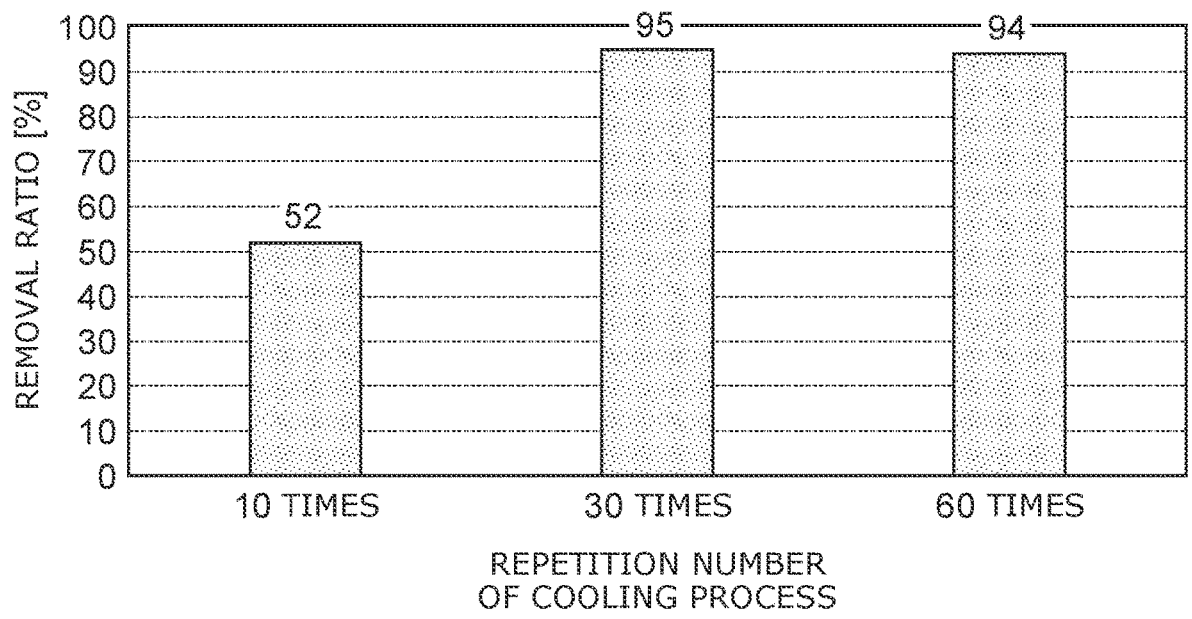
FIG. 14 is a graph for illustrating removal ratio of contaminations to number of repetitions of freeze cleaning process.

The result is shown in FIG. 14. The horizontal axis shows the number of repeated treatments, and the vertical axis shows the contamination removal ratio (PRE %). When the number of repetitions was 10, the removal ratio was 52%, when the number of repetitions was 30, the removal ratio was 95%, and when the number of repetitions was 60, the removal ratio was 94%. The temperature at which freezing started from each supercooling process was approximately −38° C. to −39° C.

According to the results shown in FIG. 14, the contamination removal ratio (PRE) was improved by increasing the number of repetitions of thawing in the solid-liquid phase, and was saturated at 30 times.

As shown in the above experimental results, when the freezing start temperature is stable, assuming that the removal ratio per time is PRE1, it is considered that PREn when repeated n times is given by the formula (3).

$$PREn = 1 - \theta^n \quad (3)$$

$\theta^n$ is the residual ratio of contaminations when the freeze-cleaning process is performed n times. PRE1 in the above experiment is estimated to be PRE1=9.5% from the removal ratio of 95% after 30 repetitions.

When the liquid 101 starts freezing at −38.7° C., becomes solid in about 52%. From this, it is considered that about 18% became solid with originating from contaminations. In either case, the pattern did not collapse.

Figure 15:
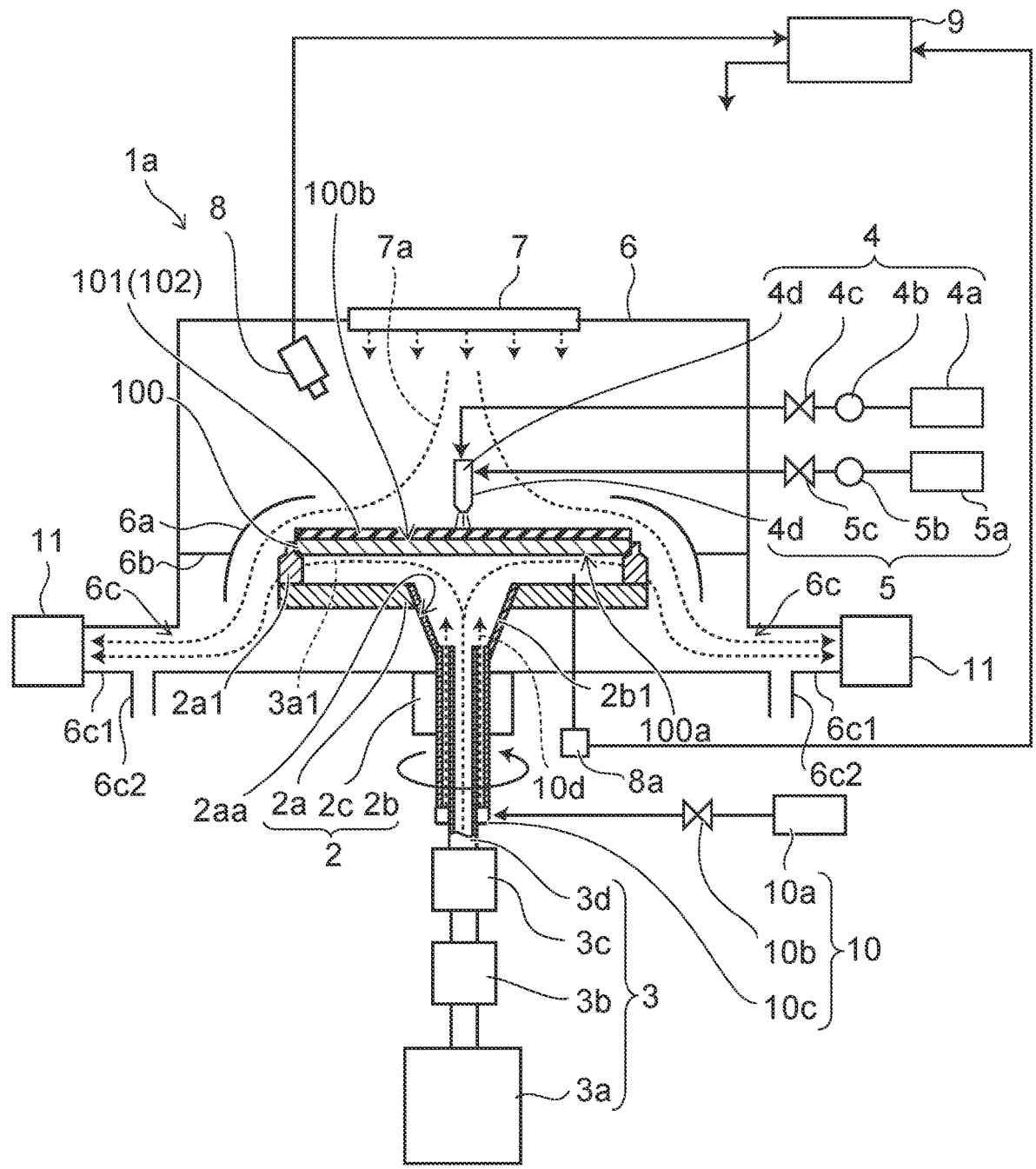
FIG. 15 is a schematic for illustrating a substrate treatment device according to another embodiment.

FIG. 15 is a schematic view for illustrating the substrate treatment device 1a according to another embodiment.

As shown in FIG. 15, a substrate treatment device 1a includes the placement part 2, the cooling part 3, the first liquid supplier 4, the second liquid supplier 5, the housing 6, the blower part 7, the detector 8, and a temperature detector 8a, a gas supplier 10, the exhaust part 11, and the controller 9.

The temperature detector 8a detects the temperature of the space between the substrate 100 and the placement stand 2a. This temperature is substantially equal to the temperature of the mixed gas (gas in which the cooling gas 3a1 and the gas 10d are mixed) flowing between the substrate 100 and the placement stand 2a. The temperature detector 8a can be, for example, a radiation thermometer, a thermoviewer, a thermocouple, a resistance temperature detector, or the like.

The gas supplier 10 includes a gas storage part 10a, a flow rate controller 10b, and a connection part 10c.

The gas storage part 10a stores and supplies the gas 10d. The gas storage part 10a can be a high-pressure cylinder or factory piping in which the gas 10d is stored.

The flow rate controller 10b controls the flow rate of the gas 10d. The flow rate controller 10b can be, for example, an MFC that directly controls the flow rate of the gas 10d, or an APC that indirectly controls the flow rate of the gas 10d by controlling the pressure.

The connecting part 10c is connected to the rotating shaft 2b. The connection part 10c connects the flow rate controller 10b and the space between the rotating shaft 2b and the cooling nozzle 3d. The connecting part 10c can be, for example, a rotary joint.

The gas 10d is not particularly limited as long as it is a gas that does not easily react with the material of the substrate 100. The gas 10d can be, for example, an inert gas such as nitrogen gas, helium gas, or argon gas. In this case, the gas 10d can be the same gas as the cooling gas 3a1. However, the temperature of the gas 10d is higher than the temperature of the cooling gas 3a1. The temperature of the gas 10d can be, for example, room temperature.

If the cooling rate of the liquid 101 becomes too high, the liquid 101 will not be in a supercooled state and will freeze immediately. That is, the supercooling process cannot be performed. In this case, the cooling rate of the liquid 101 can be controlled by at least one of the rotation speed of the substrate 100 and the flow rate of the cooling gas 3a1. However, the temperature of the cooling gas 3a1 becomes substantially constant depending on the temperature setting in the cooling part that supplies the cooling gas 3a1. Therefore, it may be difficult to decease the cooling rate of the liquid 101 at the flow rate of the cooling gas 3a1.

Further, if the rotation speed of the substrate 100 is reduced, the thickness of the liquid film becomes thicker, so that the cooling rate can be deceased. However, since the thickness of the liquid film has a limit thickness that can be maintained by surface tension, it may be difficult to decrease the cooling rate of the liquid 101 at the rotation speed of the substrate 100.

Therefore, in the embodiment, the cooling rate of the liquid 101 can be decreased by mixing the gas 10d having a temperature higher than that of the cooling gas 3a1 and the cooling gas 3a1. The cooling rate of the liquid 101 can be controlled by the flow rate of the gas 10d and the cooling gas 3a1, the mixing ratio of the gas 10d and the cooling gas 3a1, the temperature of the gas 10d, and the like.

By mixing the cooling gas 3a1 with the gas 10d having a temperature higher than that of the cooling gas 3a1, the temperature of the gas supplied to the space between the substrate 100 and the placement stand 2a can be adjusted more precisely. Therefore, the cooling temperature of the substrate 100 can be adjusted with higher accuracy. Moreover, the supercooled state of the liquid 101 can be controlled more easily.

By doing so, it is possible to increase the probability that the temperature at which the supercooled liquid 101 starts freezing can be set to −20° C. or lower. As a result, when the freeze-cleaning process is repeated until the removal ratio of contaminations is 90% or more, the number of freeze-cleaning processes can be reduced. Further, when the number of cleanings is determined in advance, it is possible to suppress the start of freezing at a temperature higher than the set temperature, so that the number of substrates 100 that cause poor cleaning can be reduced. As a result, the yield is improved.

Further, if the gas supplier 10 is provided, it becomes easy to adjust the cooling rate in the cooling process so that the temperature T at the start of freezing described above is not lower than −40° C. and not higher than −20° C.

Further, even if the detector 8 detects the temperature of the liquid film and controls the flow rate of the cooling gas 3a1, the temperature on the front surface 100b side of the substrate 100 (the temperature of the liquid film) and the temperature on the back surface 100a side of the substrate 100 may be different. Therefore, if the flow rate of the cooling gas 3a1 is controlled only based on the temperature of the liquid film detected by the detector 8, even if the temperature of the liquid film becomes an appropriate temperature, the temperature of the liquid film and the temperature of the back surface 100a of the substrate 100 may be different, and the temperature gradient in the thickness direction of the substrate 100 may become large. When the temperature gradient in the thickness direction of the substrate 100 becomes large, the density change due to the non-uniform temperature may be the starting point of freezing, and therefore the freezing timing may vary for every substrate 100.

Further, when the temperature gradient becomes large, the density variation is likely to occur, and it is considered that the change in density due to the density variation becomes the starting point of freezing. Therefore, the freezing timing may vary even within the plane of the substrate 100.

According to the embodiment, the controller 9 can control at least one of the flow rate of the gas 10d and the cooling gas 3a1 and the mixing ratio of the gas 10d and the cooling gas 3a1 based on the temperature measured by the temperature detector 8a.

Therefore, the controller 9 performs such control in the preliminary process, and can switch from the preliminary process to the supercooling process (stopping the supply of the liquid 101) after the difference between the temperature detected by the detector 8 and the temperature detected by the temperature detector 8a is within a predetermined range. By doing so, freezing can be started in a state where the temperature gradient in the thickness direction of the substrate 100 is small, so that it is possible to suppress variations in the freezing timing.

It is also possible to control the supercooled state of the liquid 101 by controlling the flow rate of the gas 10d supplied from the gas supplier 10 without controlling the flow rate of the cooling gas 3a1 (the flow rate of the cooling gas 3a1 is kept constant) by the flow rate controller 3c. In such a case, the flow rate controller 3c can be omitted.

However, if the flow rate controller 3c and the gas supplier 10 are provided, the supercooled state of the liquid 101 can be controlled more easily.

Further, the supercooled state of the liquid 101 can also be controlled by controlling the amount of air 7a supplied by the blower part 7.

The embodiments have been described. However, the invention is not limited to these embodiments. For example, any addition, deletion, or design change of components, or any addition, omission, or condition change of processes in the above embodiments suitably made by those skilled in the art are also encompassed within the scope of the invention as long as they fall within the spirit of the invention.

For example, the shape, size, number, arrangement, and the like of each component included in the substrate treatment device 1 are not limited to those illustrated, and can be appropriately changed.

For example, the detector 8 may be a refractive index meter, a laser displacement meter, an image processing device, or the like instead of the temperature sensor. In this case, the controller 9 stores in advance the freezing start temperature, the removal ratio of contaminations calculated from the ratio of the liquid and the solid at the freezing start temperature, and the transmittance, the reflectance, and the refractive index in the cloudy state of supercooled liquid 101 at the freezing start temperature. For example, since the ratio of the liquid to the solid changes depending on the freezing start temperature, the transmittance of the supercooled liquid 101 differs. By measuring this difference in transmittance in advance, the moment when freezing starts can be detected from the change in transmittance. Then, the freezing start temperature is estimated from the transmittance at that time, the removal ratio of contaminations calculated from the ratio of liquid and solid obtained in advance from the estimated freezing start temperature is calculated, and the removal ratio of the contaminations in the current freeze-cleaning process is calculated.

What is claimed is:

1. A substrate treatment device: comprising:
a placement stand configured to rotate a substrate;
a cooling part configured to supply a cooling gas into a space between the placement stand and the substrate;
a liquid supplier configured to supply a liquid on a surface of the substrate opposite to the placement stand side;
a detector configured to detect a state of the liquid on the surface of the substrate, the state of the liquid being a temperature of the liquid or a cloudy state of the liquid; and
a controller controlling at least one of a rotation speed of the substrate, a flow rate of the cooling gas, or a supply amount of the liquid,
the controller setting the liquid on the surface of the substrate to be in a supercooled state by controlling at least one of a rotation speed of the substrate, a flow rate of the cooling gas, and a supply amount of the liquid, detecting timing of start of freezing of the liquid in the supercooled state based on data of the temperature of the liquid or data of the cloudy state of the liquid from the detector, and starting thawing of the liquid in a state of solid-liquid phase has elapsed based on the detected timing of the start of freezing.

2. The device according to claim 1, wherein
when repeating a freeze-cleaning process, the controller stores a removal ratio of a contamination obtained in up to a freeze-cleaning process immediately before a current freeze-cleaning process into a memory, obtains a temperature of the liquid in the supercooled state at the start of freezing in the current freeze-cleaning process based on the data from the detector, and is configured to calculate a removal ratio of a contamination obtained in up to the current freeze-cleaning process from the removal ratio of the contamination obtained in up to the freeze-cleaning process immediately before the current freeze-cleaning process and a relationship between a temperature obtained in advance at the start of freezing and a removal ratio of the contamination, and the obtained temperature at the start of freezing based on the data from the detector.

3. The device according to claim 2, wherein
the controller is configured to perform the freeze-cleaning process, the freeze-cleaning process including,
   a supercooling process setting the liquid on the surface of the substrate to be in a supercooled state by controlling at least one of the rotation speed of the substrate or the flow rate of the cooling gas,
   freezing process causing the liquid in the supercooled state to freeze and causing the liquid to co-exist with the freezed liquid by controlling at least one of the rotation speed of the substrate, the flow rate of the cooling gas, or the supply amount of the liquid after the supercooling process, and
   thawing process thawing the freezed liquid by controlling at least one of the rotation speed of the substrate, the flow rate of the cooling gas, or the supply amount of the liquid, and
the controller is configured to perform the freeze-cleaning process repeatedly until the removal ratio of the contamination obtained in processes up to the current freeze-cleaning process reaches a predetermined value set in advance.

4. The device according to claim 3, wherein
after the removal ratio of the contamination obtained in processes up to the current freeze-cleaning process reaches the predetermined value, the controller is configured to further perform the freeze-cleaning process a predetermined number of times stored in advance.

5. The device according to claim 4, wherein
when number of times of the freeze-cleaning processes exceeds a predetermined range, the controller is configured to carry the substrate out of the substrate treatment device.

6. The device according to claim 5, wherein
the controller is configured to transmit data of the carried out substrate to an external device.

7. The device according to claim 2, wherein
the controller is configured to perform the freeze-cleaning process, the freeze-cleaning process including,
   a supercooling process setting the liquid on the surface of the substrate to be in a supercooled state,
   freezing process causing the liquid to co-exist with the freezed liquid after the supercooling process, and
   thawing process thawing the freezed liquid by controlling at least one of the rotation speed of the substrate, the flow rate of the cooling gas, or the supply amount of the liquid,
the controller maintains the flow rate of the cooling gas to be constant in the supercooling process and the freezing process, and
the controller is configured to perform the freeze-cleaning process repeatedly until the removal ratio of the contamination obtained in processes up to the current freeze-cleaning process reaches a predetermined value set in advance.

8. The device according to claim 7, wherein
after the removal ratio of the contamination obtained in processes up to the current freeze-cleaning process reaches the predetermined value, the controller is configured to further perform the freeze-cleaning process a predetermined number of times stored in advance.

9. The device according to claim 8, wherein
when number of times of the freeze-cleaning processes exceeds a predetermined range, the controller is configured to carry the substrate out of the substrate treatment device.

* * * * *